(12) United States Patent
Ju et al.

(10) Patent No.: US 12,278,235 B2
(45) Date of Patent: Apr. 15, 2025

(54) SEMICONDUCTOR DEVICE WITH ISOLATION STRUCTURE

(71) Applicant: TAIWAN SEMICONDUCTOR MANUFACTURING COMPANY, LTD., Hsinchu (TW)

(72) Inventors: Shi-Ning Ju, Hsin Chiu (TW); Kuo-Cheng Chiang, Zhubei (TW); Kuan-Lun Cheng, Tainan (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/425,797

(22) Filed: Jan. 29, 2024

(65) Prior Publication Data

US 2024/0194674 A1 Jun. 13, 2024

Related U.S. Application Data

(60) Continuation of application No. 17/857,740, filed on Jul. 5, 2022, now Pat. No. 11,923,361, which is a
(Continued)

(51) Int. Cl.
*H01L 27/088* (2006.01)
*H01L 21/762* (2006.01)
(Continued)

(52) U.S. Cl.
CPC .... *H01L 27/0886* (2013.01); *H01L 21/76224* (2013.01); *H01L 21/823431* (2013.01);
(Continued)

(58) Field of Classification Search
CPC .......... H01L 27/0886; H01L 21/76224; H01L 21/823431; H01L 29/0847;
(Continued)

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

KR   10-2015-0033496 A   4/2015
KR   10-2018-0070316 A   6/2018
KR   10-2019-0024535 A   3/2019

*Primary Examiner* — Jonathan Han
(74) *Attorney, Agent, or Firm* — Birch, Stewart, Kolasch & Birch, LLP

(57) ABSTRACT

A semiconductor device structure is provided. The semiconductor device structure includes multiple semiconductor nanostructures and a gate stack wrapped around the semiconductor nanostructures. The semiconductor device structure also includes a first epitaxial structure and a second epitaxial structure sandwiching one or more of the semiconductor nanostructures. The semiconductor device structure further includes an isolation structure continuously extending across edges of the semiconductor nanostructures.

20 Claims, 35 Drawing Sheets

Related U.S. Application Data division of application No. 16/871,740, filed on May 11, 2020, now Pat. No. 11,424,242.

(60) Provisional application No. 62/928,654, filed on Oct. 31, 2019.

(51) Int. Cl.
| | |
|---|---|
| *H01L 21/8234* | (2006.01) |
| *H01L 29/08* | (2006.01) |
| *H01L 29/423* | (2006.01) |
| *H01L 29/66* | (2006.01) |
| *H01L 29/78* | (2006.01) |
| *H01L 29/786* | (2006.01) |

(52) U.S. Cl.
CPC .... *H01L 29/0847* (2013.01); *H01L 29/42392* (2013.01); *H01L 29/66545* (2013.01); *H01L 29/66787* (2013.01); *H01L 29/785* (2013.01); *H01L 29/78696* (2013.01)

(58) Field of Classification Search
CPC ......... H01L 29/42392; H01L 29/66545; H01L 29/66787; H01L 29/785; H01L 29/78696; H01L 29/0653; H01L 29/42376; H01L 21/823412; H01L 21/823481; H01L 29/1079; H01L 29/0673; H01L 29/66439; H01L 29/66553; H01L 29/6656; H01L 29/775; H01L 29/7849; H01L 27/088; H01L 21/823437; H01L 21/823821; H01L 21/823828; H01L 21/823878; H01L 27/0924; H01L 29/66772; H01L 29/78654; B82Y 10/00
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,263,100 B1 * | 4/2019 | Bi | H01L 29/42364 |
| 10,535,733 B2 * | 1/2020 | Cheng | H01L 29/785 |
| 10,573,755 B1 | 2/2020 | Frougier et al. | |
| 2015/0279947 A1 | 10/2015 | Waldron et al. | |
| 2017/0133378 A1 | 5/2017 | Zhu et al. | |
| 2017/0179281 A1 | 6/2017 | Chan et al. | |
| 2018/0138291 A1 | 5/2018 | Smith et al. | |
| 2018/0175035 A1 | 6/2018 | Yang et al. | |
| 2018/0301564 A1 * | 10/2018 | Kwon | H01L 29/0653 |
| 2019/0067441 A1 | 2/2019 | Yang et al. | |
| 2019/0103317 A1 | 4/2019 | Yu et al. | |
| 2019/0305106 A1 | 10/2019 | Bi et al. | |
| 2019/0319119 A1 | 10/2019 | Li et al. | |
| 2020/0035705 A1 * | 1/2020 | Kim | H01L 21/823481 |
| 2020/0052107 A1 * | 2/2020 | Lie | H01L 27/088 |
| 2020/0227305 A1 * | 7/2020 | Cheng | H01L 29/66545 |
| 2021/0119031 A1 * | 4/2021 | Song | H01L 27/0924 |

* cited by examiner

SEMICONDUCTOR DEVICE WITH ISOLATION STRUCTURE

PRIORITY CLAIM AND CROSS-REFERENCE

This Application is a Continuation application of U.S. application Ser. No. 17/857,740, filed on Jul. 5, 2022, which is a Divisional of U.S. application Ser. No. 16/871,740, filed on May 11, 2020, which claims the benefit of U.S. Provisional Application No. 62/928,654, filed on Oct. 31, 2019, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
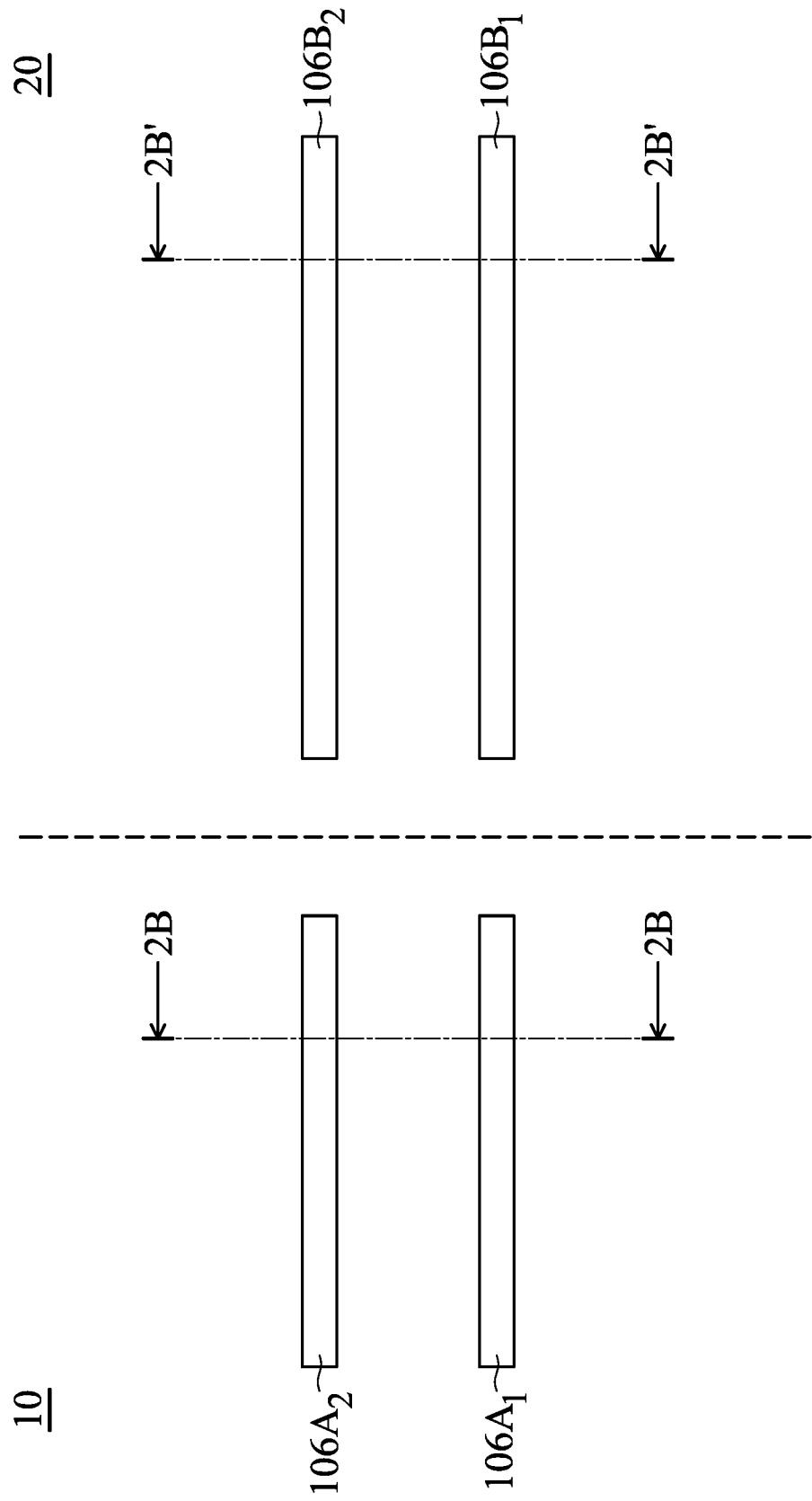
FIGS. 1A-1B are top views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10° . The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
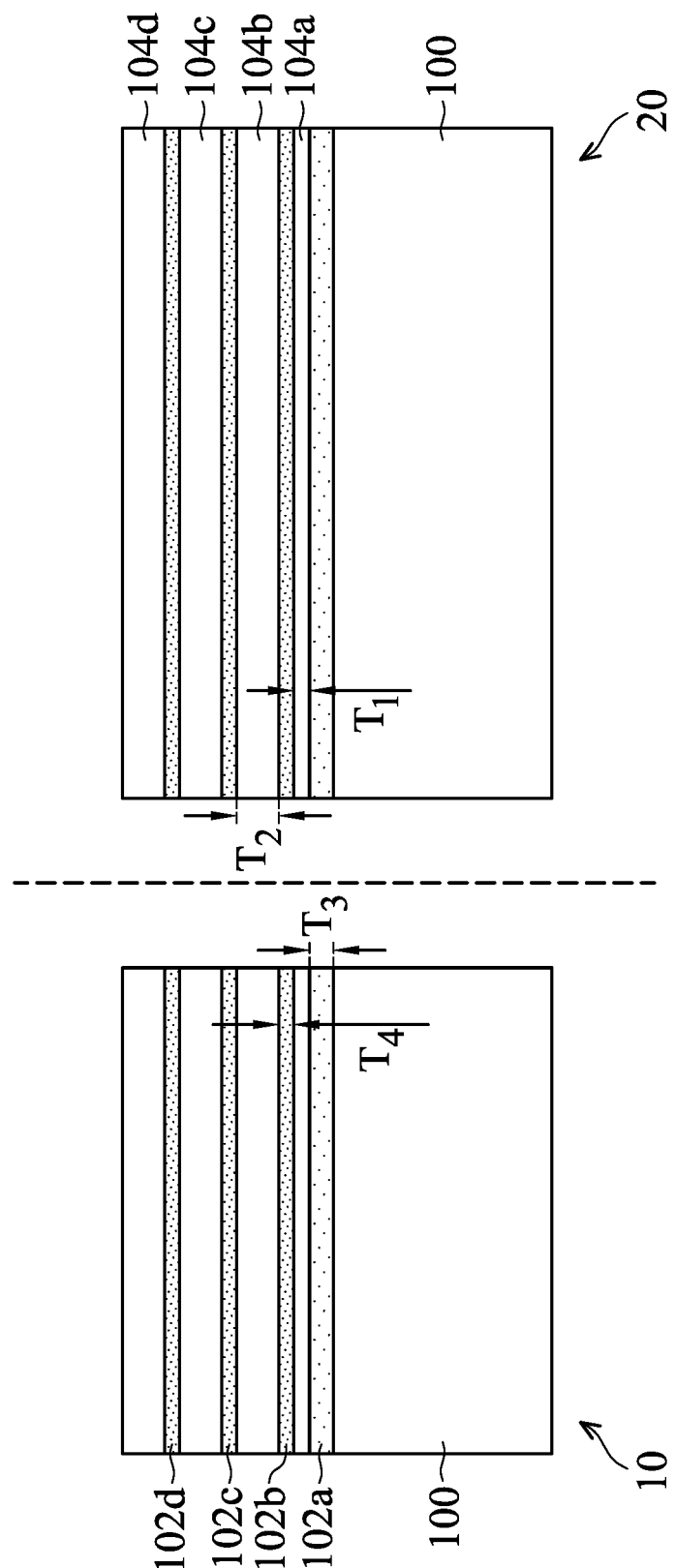
FIGS. 2A-2I are cross-sectional views of various stages of a process for forming a semiconductor device structure, in accordance with some embodiments.

FIGS. 2A-2I are cross-sectional views of various stages of a process for forming a semiconductor device structure, in accordance with some embodiments. As shown in FIG. 2A, a semiconductor substrate 100 is received or provided. The semiconductor substrate 100 has a first region 10 and a second region 20. In some embodiments, one or more short channel (SC) devices are to be formed over the first region 10. One or more long channel (LC) devices are to be formed over the second region 20. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. The semiconductor stack covers the first region 10 and the second region 20 of the semiconductor substrate 100. In some embodiments, the semiconductor stack includes multiple semiconductor layers 102a, 102b, 102c, and 102d, and the semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layer 102a is used as a sacrificial base layer and will be partially or completely removed in a subsequent process. In some embodiments, the semiconductor layer 104a functions as a protective layer that prevents the semiconductor layer 102b thereon from being damaged during the subsequent fabrication processes. In some embodiments, the semiconductor layers 102b-102d function as sacrificial layers that will be removed in a subsequent process to release the semiconductor layers 104b-104d. The released semiconductor layers 104b-104d may function as channel structures of one or more transistors.

In some embodiments, the semiconductor layer 104a is thinner than the semiconductor layer 104b, 104c, or 104d. As shown in FIG. 2A, the semiconductor layer 104a has a thickness $T_1$, and the semiconductor layer 104b has a thickness $T_2$. In some embodiments, the thickness $T_2$ is greater than the thickness $T_1$. The thickness $T_1$ may be in a range from about 2 nm to about 6 nm. For example, the thickness $T_1$ is about 4 nm. The ratio ($T_1/T_2$) of the thickness $T_1$ to the thickness $T_2$ may be in a range from about 2/5 to about 2/3. In some other embodiments, the ratio ($T_1/T_2$) of the thickness $T_1$ to the thickness $T_2$ is in a range from about 3/5 to about 3/4. The ratio ($T_1/T_2$) will be discussed in more detail later.

In some embodiments, each of the semiconductor layers 102b-102d and 104b-104d has substantially the same thickness. In some embodiments, each of the semiconductor layers 104b-104d is thicker than each of the semiconductor layers 102a-102d. In some other embodiments, each of the semiconductor layers 102a-102d is thicker than each of the semiconductor layers 104b-104d.

In some embodiments, the semiconductor layer 102a (that functions as a sacrificial base layer) is thicker than or substantially as thick as the semiconductor layer 102b, 102c, or 102d (that functions as a sacrificial layer). As shown in FIG. 2A, the semiconductor layer 102a has a thickness $T_3$, and the semiconductor layer 102b has a thickness $T_4$. In some embodiments, the thickness $T_3$ is greater than the thickness $T_4$. The thickness $T_3$ may be in a range from about 4 nm to about 10 nm. For example, the thickness $T_3$ is about 5 nm. The ratio ($T_3/T_4$) of the thickness $T_3$ to the thickness $T_4$ may be in a range from about 1 to about 2. In some other embodiments, the ratio ($T_3/T_4$) of the thickness $T_3$ to the thickness $T_4$ is in a range from about 1.1 to about 1.8. The ratio ($T_3/T_4$) will be discussed in more detail later.

In some embodiments, the semiconductor layers 102a-102d and the semiconductor layers 104a-104d are made of different materials. In some embodiments, the semiconductor layers 102a-102d are made of or include silicon germanium or germanium, and the semiconductor layers 104a-104d are made of or include silicon.

In some embodiments, the semiconductor layer 102a has a different atomic concentration of germanium than that of the semiconductor layer 102b, 102c, or 102d. In some embodiments, the semiconductor layer 102a has a greater atomic concentration of germanium than that of the semiconductor layer 102b, 102c, or 102d. The atomic concentration of germanium of the semiconductor layer 102a may be in a range from about 35% to about 50%. The atomic concentration of germanium of the semiconductor layer 102b, 102c, or 102d may be in a range from about 15% to about 25%. The greater atomic concentration of germanium of the semiconductor layer 102a enables the semiconductor layer 102a to have different etching selectivity to the semiconductor layers 102b, 102c, and 102d.

In some embodiments, the semiconductor layers 102a-102d and the semiconductor layers 104a-104d are formed using multiple epitaxial growth operations. Each of the semiconductor layers 102a-102d and the semiconductor layers 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102a-102d and the semiconductor layers 104a-104d are grown in-situ in the same process chamber. In some embodiments, the growth of the semiconductor layers 102a-102d and the growth of the semiconductor layers 104a-104d are alternately and sequentially performed in the same process chamber to complete the formation of the semiconductor stack. In some embodiments, the vacuum of the process chamber is not broken before the epitaxial growth of the semiconductor stack is accomplished.

Figure 2B:
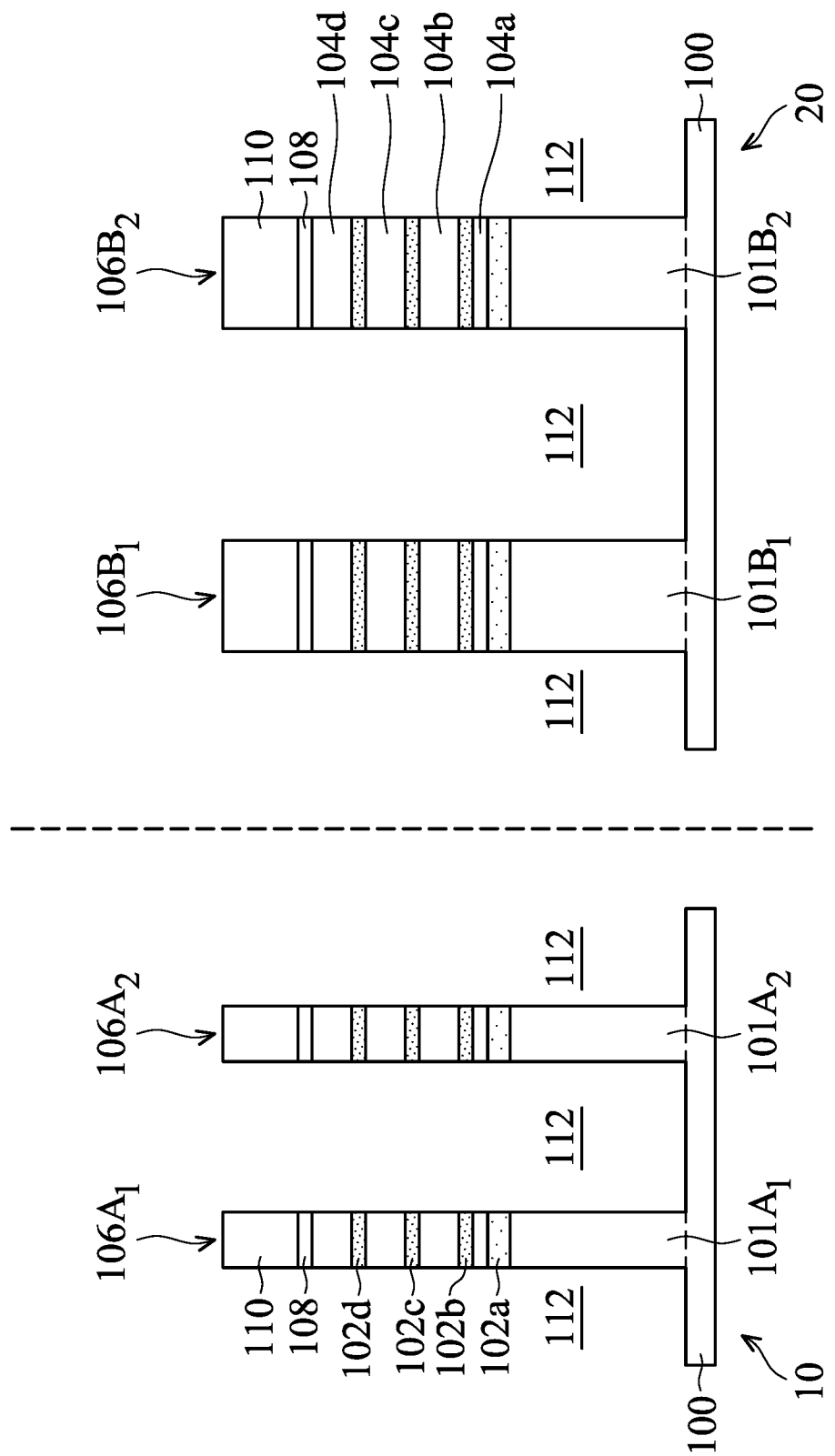

Afterwards, hard mask elements are formed over the semiconductor stack to assist in a subsequent patterning of the semiconductor stack. One or more etching processes are used to pattern the semiconductor stack into fin structures $106A_1$, $106A_2$, $106B_1$ and $106B_2$, as shown in FIG. 2B in accordance with some embodiments. The fin structures $106A_1$ and $106A_2$ are formed over the first region 10, and the fin structures $106B_1$ and $106B_2$ are formed over the second region 20. The semiconductor stack is partially removed to form multiple trenches 112, as shown in FIG. 2B. Each of the fin structures $106A_1$, $106A_2$, $106B_1$ and $106B_2$ may include portions of the semiconductor layers 102a-102d and 104a-104d and semiconductor fin $101A_1$, $101A_2$, $101B_1$ or $101B_2$. The semiconductor substrate 100 may also be partially removed during the etching process for forming the fin structures $106A_1$, $106A_2$, $106B_1$ and $106B_2$. Protruding portions of the semiconductor substrate 100 that remain form the semiconductor fins $101A_1$, $101A_2$, $101B_1$ and $101B_2$.

Each of the hard mask elements used for patterning the semiconductor stack may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102a-102d and 104a-104d. The second mask layer 110 may be made of silicon nitride, silicon oxynitride, silicon carbide, one or more other suitable materials, or a combination thereof.

Figure 1B:
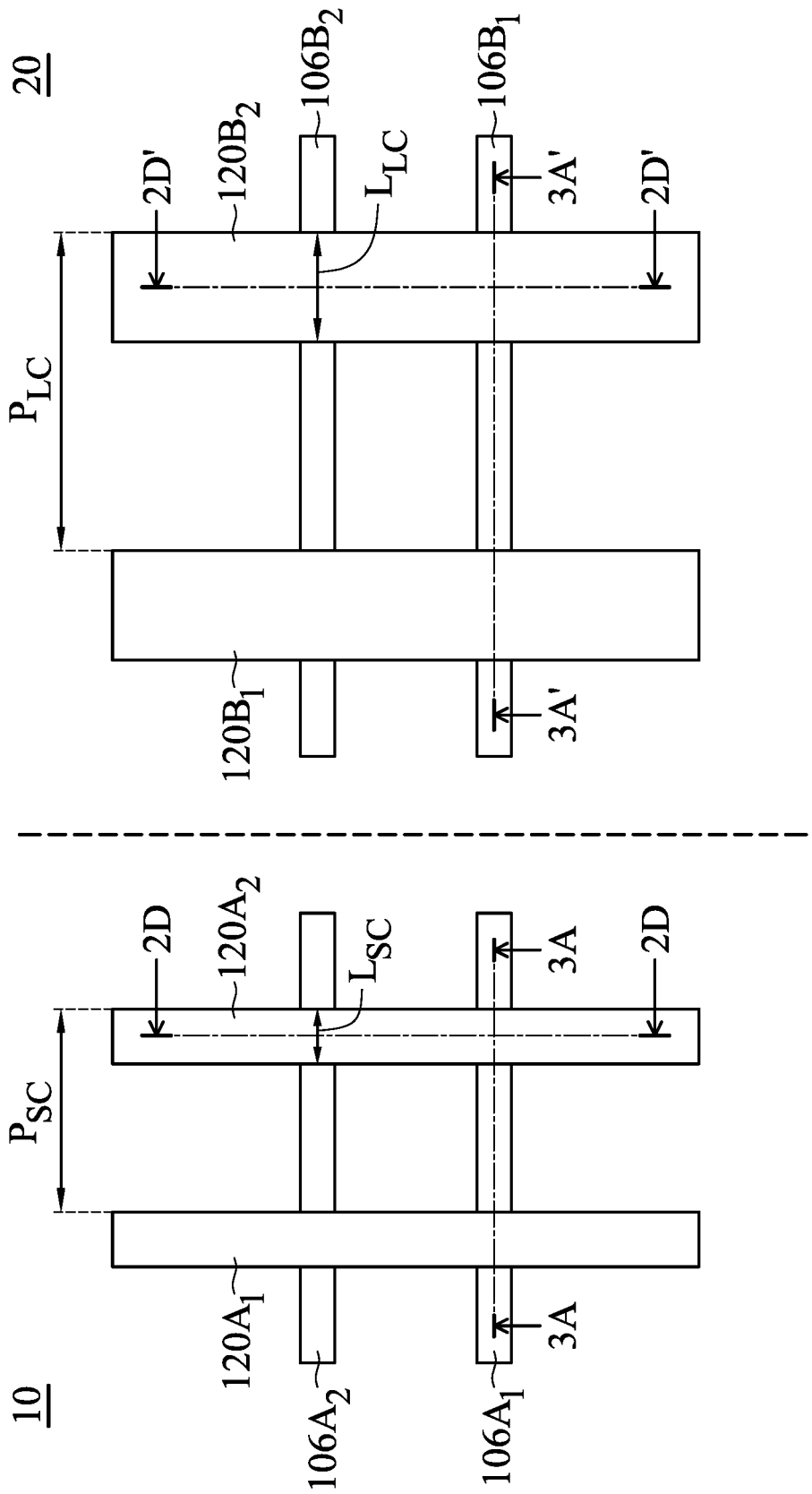

FIGS. 1A-1B are top views of various stages of a process for forming a semiconductor device structure, in accordance with some embodiments. In some embodiments, the extending directions of the fin structures $106A_1$, $106A_2$, $106B_1$ and $106B_2$ are substantially parallel to each other, as shown in FIG. 1A. In some embodiments, FIG. 2B is a cross-sectional view of the structure taken along the lines 2B-2B and 2B'-2B' in FIG. 1A.

Figure 2C:
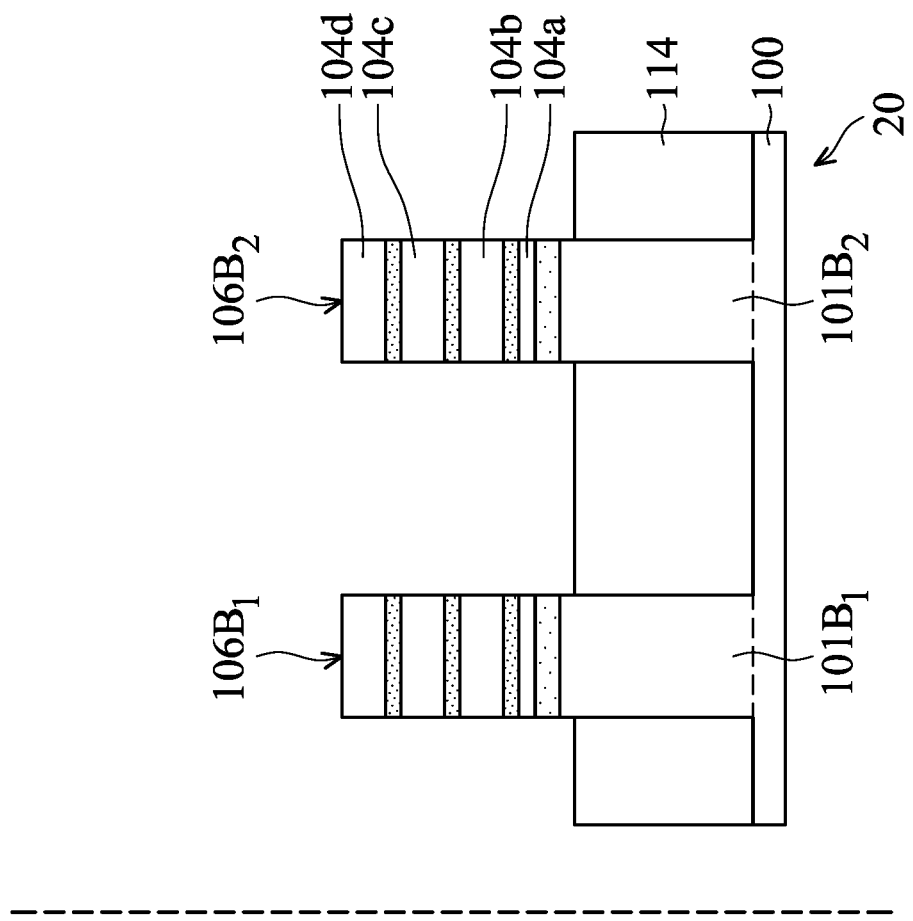
Figure 2C:
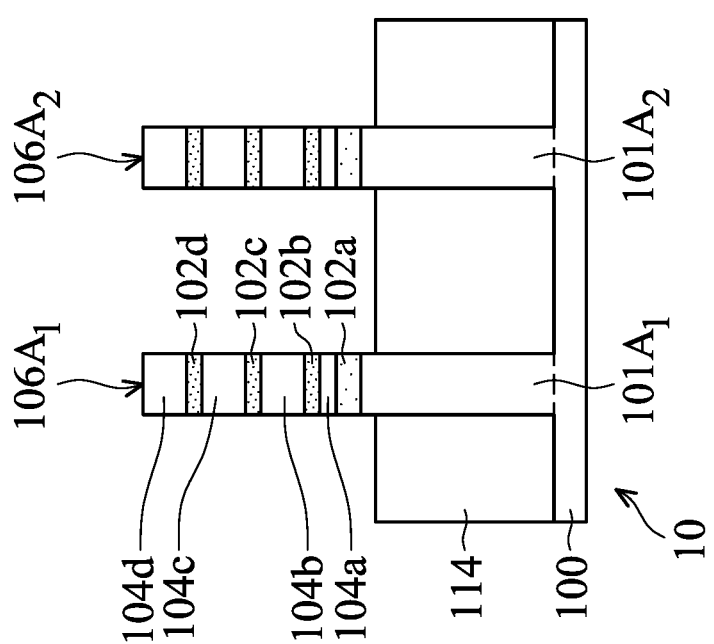

As shown in FIG. 2C, an isolation feature 114 is formed to surround lower portions of the fin structures $106A_1$, $106A_2$, $106B_1$ and $106B_2$, in accordance with some embodiments. In some embodiments, one or more dielectric layers are deposited over the fin structures $106A_1$, $106A_2$, $106B_1$ and $106B_2$ and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation feature 114. Upper portions of the fin structures $106A_1$, $106A_2$, $106B_1$ and $106B_2$ protrude from the top surface of the isolation feature 114, as shown in FIG. 2C. Afterwards, the hard mask elements (including the first mask layer 108 and the second mask layer 110) are removed. Alternatively, in some other embodiments, the hard mask elements are removed or consumed during the planarization process and/or the etching back process.

Figure 2D:
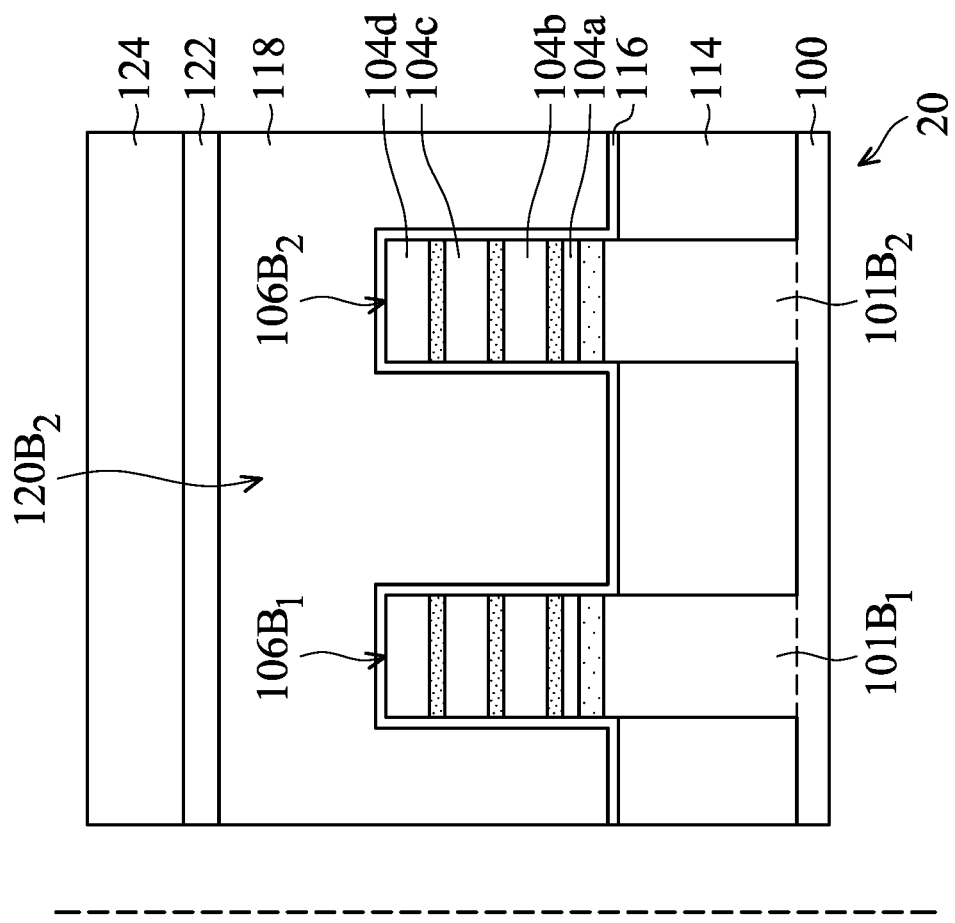
Figure 2D:
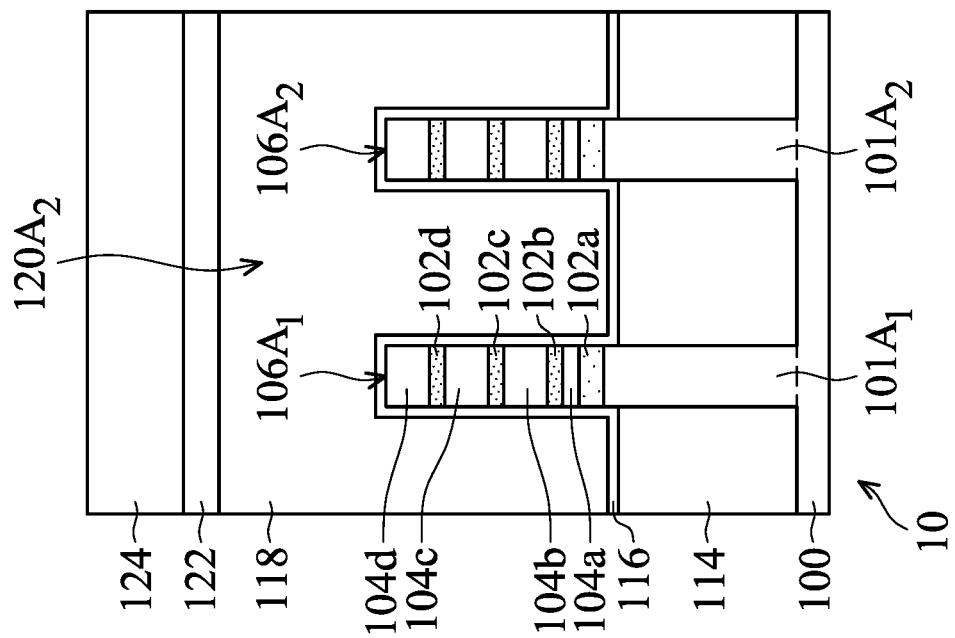
Figure 3A:
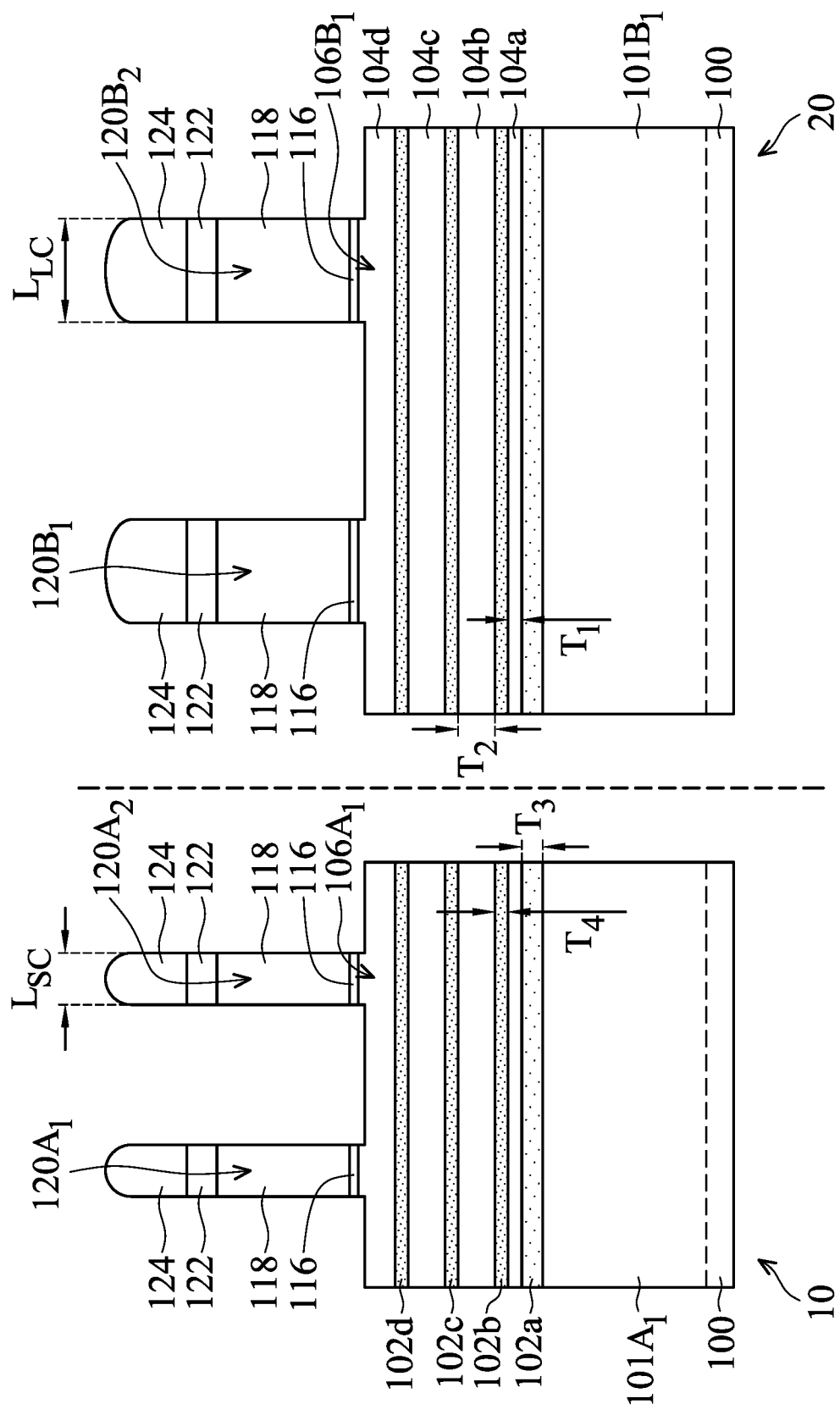
FIGS. 3A-3K are cross-sectional views of various stages of a process for forming a semiconductor device structure, in accordance with some embodiments.

Afterwards, dummy gate stacks $120A_1$, $120A_2$, $120B_1$, and $120B_2$ are formed to extend across the fin structures $106A_1$, $106A_2$, $106B_1$ and $106B_2$, as shown in FIG. 1B in accordance with some embodiments. In some embodiments, FIG. 2D is a cross-sectional view of the structure taken along the lines 2D-2D and 2D'-2D' in FIG. 1B. FIGS. 3A-3K are cross-sectional views of various stages of a process for forming a semiconductor device structure, in accordance with some embodiments. In some embodiments, FIG. 3A is a cross-sectional view of the structure taken along the lines 3A-3A and 3A'-3A' in FIG. 1B.

As shown in FIGS. 1B, 2D, and 3A, the dummy gate stacks $120A_1$, $120A_2$, $120B_1$, and $120B_2$ are formed to partially cover and to extend across the fin structures $106A_1$, $106A_2$, $106B_1$ and $106B_2$, in accordance with some embodiments. In some embodiments, the dummy gate stacks $120A_1$ and $120A_2$ wraps around the fin structures $106A_1$ and $106A_2$.

The dummy gate stacks $120B_1$ and $120B_2$ wraps around the fin structures $106B_1$ and $106B_2$. As shown in FIG. 2D, the dummy gate stack $120A_2$ extends across and wraps around the fin structures $106A_1$ and $106A_2$, and the dummy gate stack $120B_2$ extends across and wraps around the fin structures $106B_1$ and $106B_2$.

In some embodiments, the device formed over the second region 20 has a longer channel width than the device formed over the first region 10. As shown in FIG. 1B, the device formed over the first region 10 has a channel width $L_{SC}$, and the device formed over the second region 20 has a channel width $L_{LC}$. The channel width $L_{LC}$ is longer than the channel width $L_{SC}$. The channel width $L_{SC}$ may be in a range from about 4 nm to about 20 nm. The channel width $L_{LC}$ may be in a range from about 22 nm to about 40 nm. As shown in FIG. 1B, the pitch $P_{LC}$ between the dummy gate stacks $120B_1$ and $120B_2$ is longer than the pitch $P_{SC}$ between the dummy gate stacks $120A_1$ and $120A_2$. The pitch $P_{SC}$ may be in a range from about 15 nm to about 60 nm. The pitch $P_{LC}$ may be in a range from about 65 nm to about 120 nm.

As shown in FIGS. 2D and 3A, each of the dummy gate stacks $120A_1$, $120A_2$, $120B_1$, and $120B_2$ includes a dummy gate dielectric layer 116 and a dummy gate electrode 118. The dummy gate dielectric layer 116 may be made of or include silicon oxide. The dummy gate electrodes 118 may be made of or include polysilicon. In some embodiments, a dummy gate dielectric material layer and a dummy gate electrode layer are sequentially deposited over the isolation feature 114 and the fin structures $106A_1$, $106A_2$, $106B_1$ and $106B_2$. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks $120A_1$, $120A_2$, $120B_1$, and $120B_2$.

In some embodiments, hard mask elements including mask layers 122 and 124 are used to assist in the patterning process for forming the dummy gate stacks $120A_1$, $120A_2$, $120B_1$, and $120B_2$. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate dielectric layers 116 and the dummy gate electrodes 118 of the dummy gate stacks $120A_1$, $120A_2$, $120B_1$, and $120B_2$, respectively.

Figure 3B:
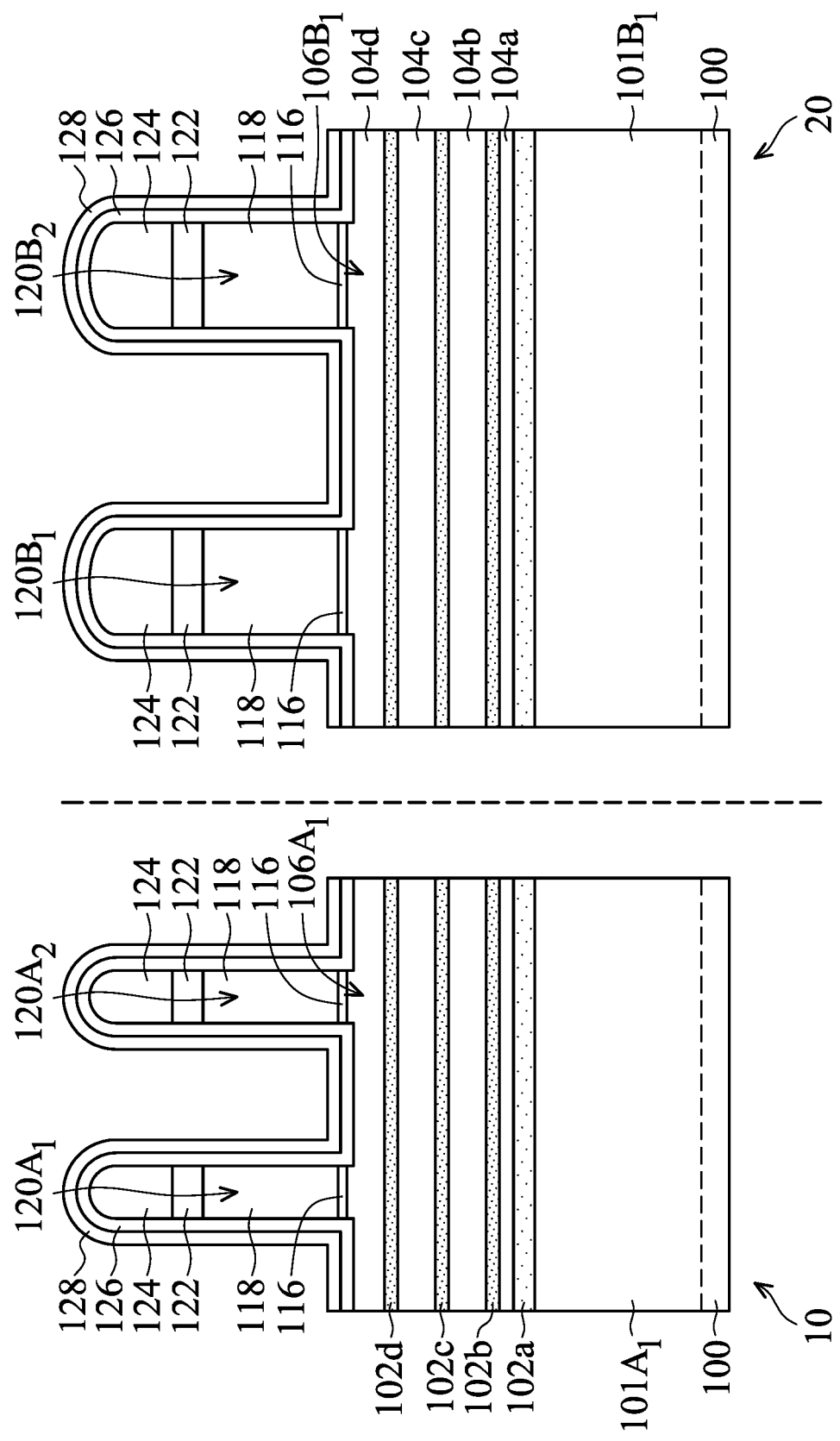

As shown in FIG. 3B, spacer layers 126 and 128 are afterwards deposited over the structure shown in FIG. 3A, in accordance with some embodiments. The spacer layers 126 and 128 extend along the sidewalls of the dummy gate stacks $120A_1$, $120A_2$, $120B_1$, and $120B_2$. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof. The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
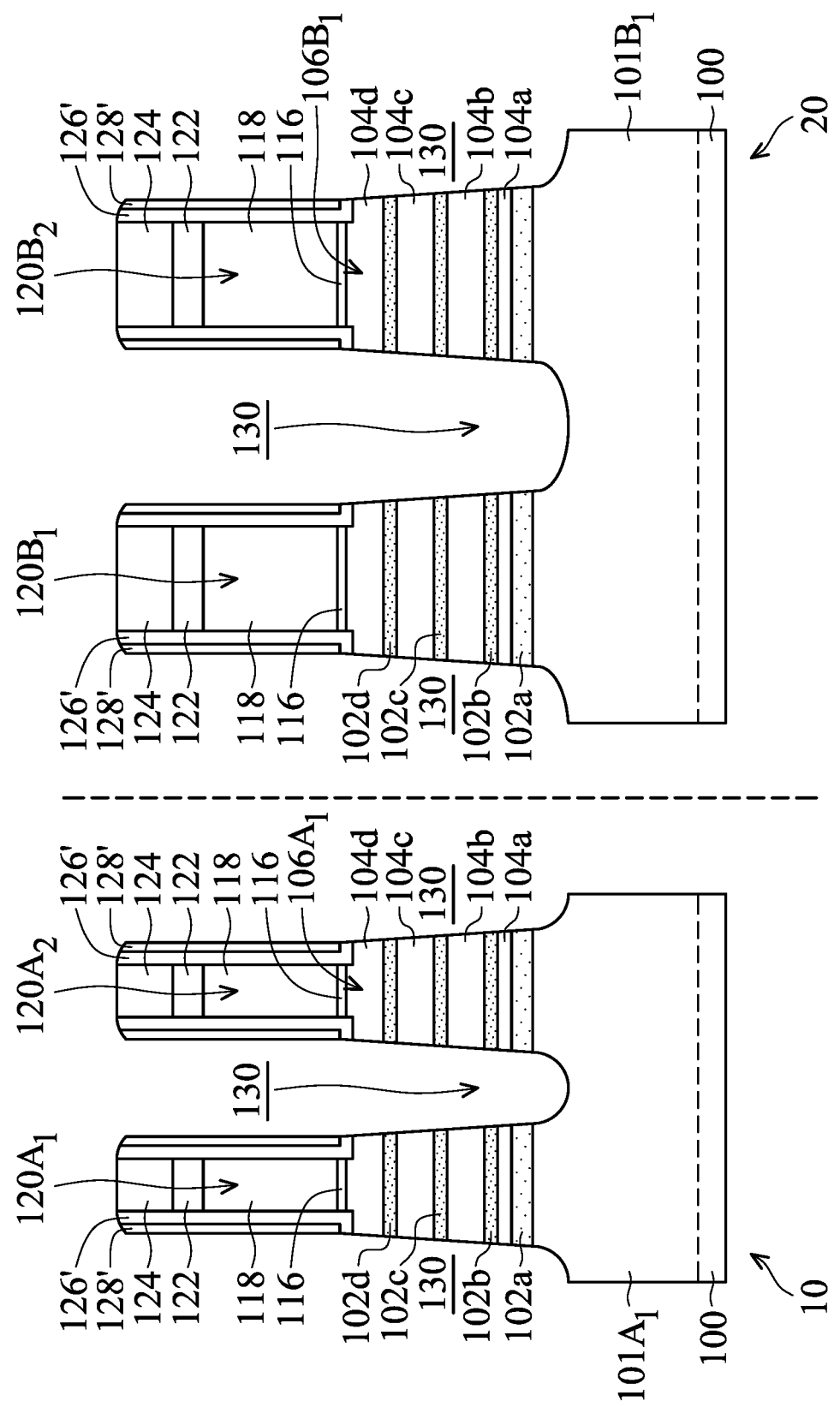

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks $120A_1$, $120A_2$, $120B_1$, and $120B_2$, as shown in FIG. 3C.

The fin structures $106A_1$, $106A_2$, $106B_1$ and $106B_2$ are partially removed to form recesses 130 that are used to contain epitaxial structures (such as source/drain structures) that will be formed later. The recesses 130 expose the side surfaces of the semiconductor layers $102a$-$102d$ and $104a$-$104d$.

One or more etching processes may be used to form the recesses 130. In some embodiments, a dry etching process is used to form the recesses 130. Alternatively, a wet etching process may be used to form the recesses 130. In some embodiments, each of the recesses 130 penetrates through the fin structure $106A_1$ or $106B_1$. In some embodiments, the recesses 130 further extend into the semiconductor fin (such as the semiconductor fin $101A_1$ or $101B_1$), as shown in FIG. 3C. The recesses 130 extend downwards to exceed the top surfaces of the semiconductor fins $101A_1$ and $101B_1$. In some embodiments, the spacer elements 126' and 128' and the recesses 130 are formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer $104d$) is shorter than a lower semiconductor layer (such as the semiconductor layer $104b$).

However, embodiments of the disclosure have many variations. In some other embodiments, the recesses 130 have substantially vertical sidewalls. In these cases, due to the profile of the recesses 130, an upper semiconductor layer (such as the semiconductor layer $104d$) is substantially as wide as a lower semiconductor layer (such as the semiconductor layer $104b$).

Figure 3D:
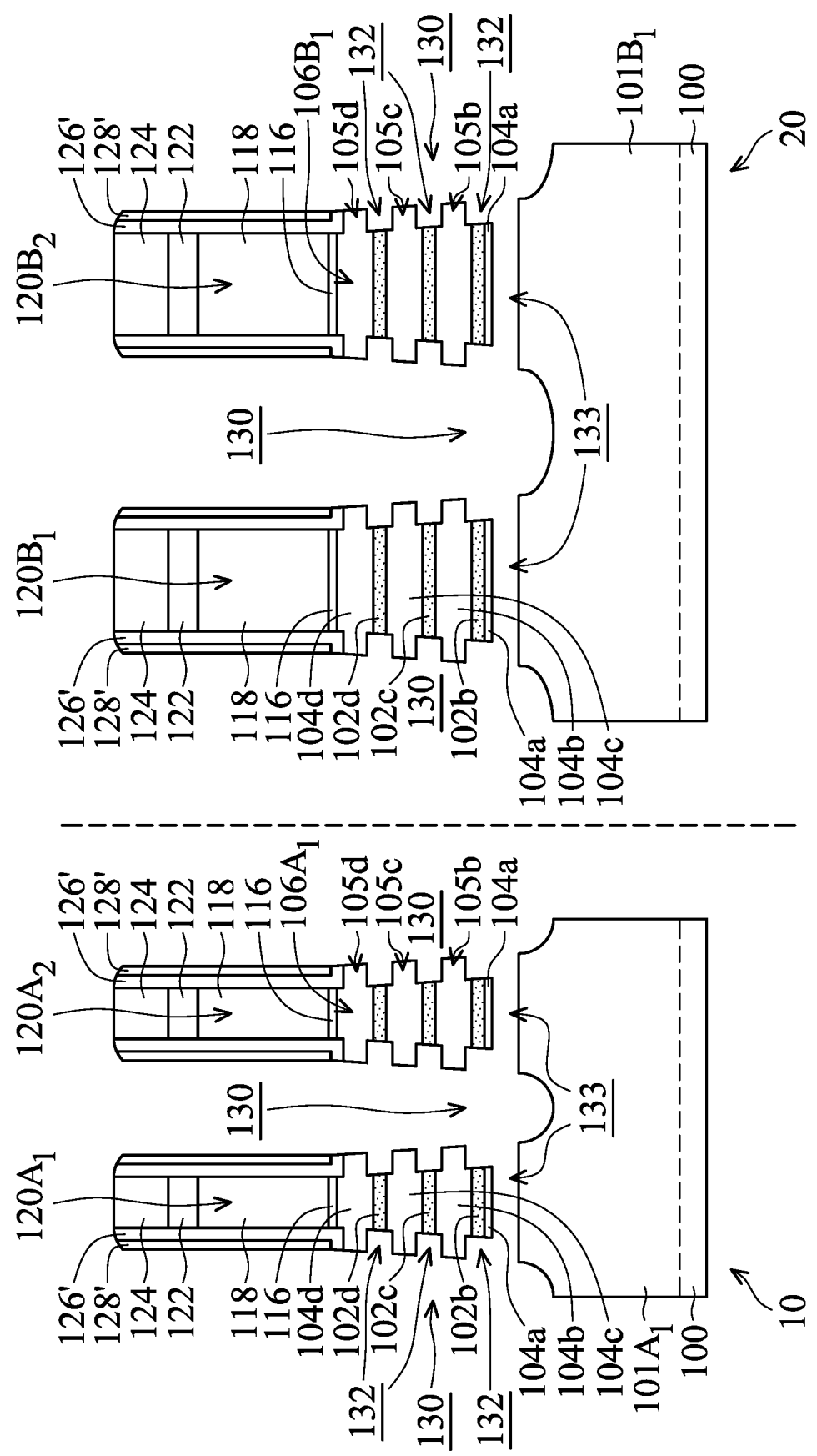

As shown in FIG. 3D, the semiconductor layers $102b$-$102d$ are laterally etched from the side surfaces of the semiconductor layers $102b$-$102d$ that are exposed by the recesses 130, in accordance with some embodiments. As a result, edges of the semiconductor layers $102b$-$102d$ retreat from edges of the semiconductor layers $104a$-$104d$. As shown in FIG. 3D, recesses 132 are formed due to the lateral etching of the semiconductor layers $102b$-$102d$. The recesses 132 may be used to contain inner spacers that will be formed later. The semiconductor layers $102b$-$102d$ may be laterally etched using a wet etching process, a dry etching process, or a combination thereof.

Figure 2E:
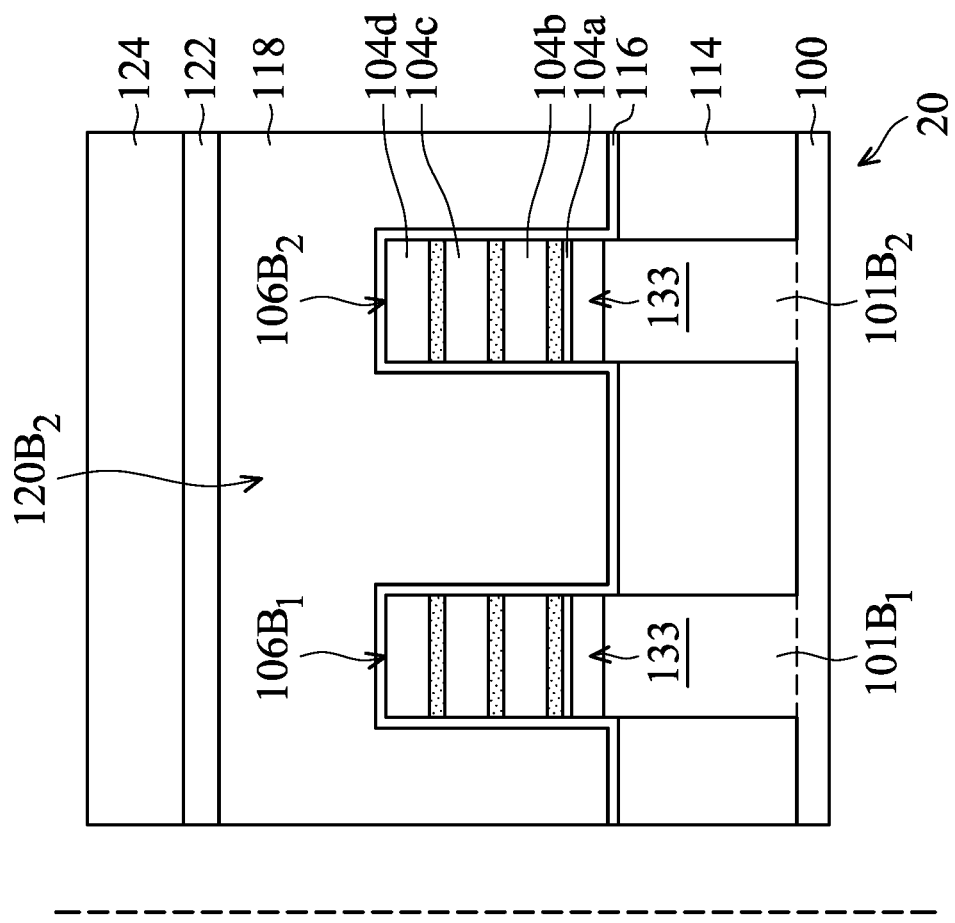
Figure 2E:
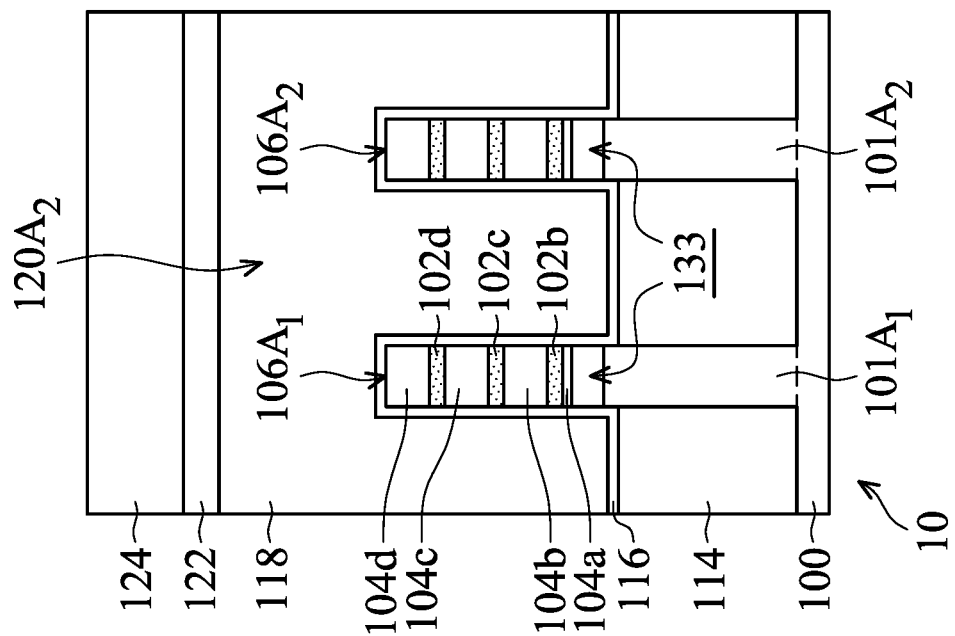

In some embodiments, the semiconductor layer $102a$ (that functions as a sacrificial base layer) is completely or partially removed. In some embodiments, the semiconductor layer $102a$ is completely removed to form recesses 133, as shown in FIGS. 3D and 2E. Due to the support of the dummy gate stacks $120A_1$, $120A_2$, $120B_1$, and $120B_2$ (as shown in FIG. 2E), the fin structures $106A_1$, $106A_2$, $106B_1$ and $106B_2$ are prevented from falling down even if the semiconductor layer $102a$ is completely removed. In some embodiments, the semiconductor layer $102a$ is simultaneously etched during the lateral etching of the semiconductor layers $102b$-

102d. In some embodiments, the semiconductor layers 102a-102d are etched using the same etching process. During the removal of the semiconductor layer 102a, the semiconductor layer 104a functions as a protective layer to prevent the semiconductor layer 102b above from being etched or damaged from the bottom surface of the semiconductor layer 102b.

As mentioned above, in some embodiments, the semiconductor layer 102a (that function as a sacrificial base layer) is thicker than the semiconductor layer 102b, 102c, or 102d (that functions as a sacrificial layer). As mentioned above, in some embodiments, the semiconductor layer 102a has a greater atomic concentration of germanium than that of the semiconductor layer 102b, 102c, or 102d. Because the semiconductor layer 102a is thicker and/or has a greater atomic concentration of germanium, the semiconductor layer 102a may be etched at a greater etching rate than the semiconductor layers 102b-102d. As a result, after the etching process, the semiconductor layer 102a is completely removed to form the recesses 133 while the semiconductor layers 102b-102d are partially etched to form the recesses 132, as shown in FIG. 3D in accordance with some embodiments.

During the etching of the semiconductor layers 102a-102d, the semiconductor layers 104a-104d may also be slightly etched. As a result, edge portions of the semiconductor layers 104b-104d are partially etched and thus shrink to become edge elements 105b-105d, as shown in FIG. 3D. As shown in FIG. 3D, each of the edge elements 105b-105d of the semiconductor layers 104b-104d is thinner than the corresponding inner portion of the semiconductor layers 104b-104d. In some embodiments, since the semiconductor layer 104a is thinner than each of the semiconductor layers 104b-104d, no edge portion is formed beside the semiconductor layer 104a. As shown in FIGS. 3D and 2E, the semiconductor layer 104a becomes thinner after the formation the recesses 133, in accordance with some embodiments.

Figure 3E:
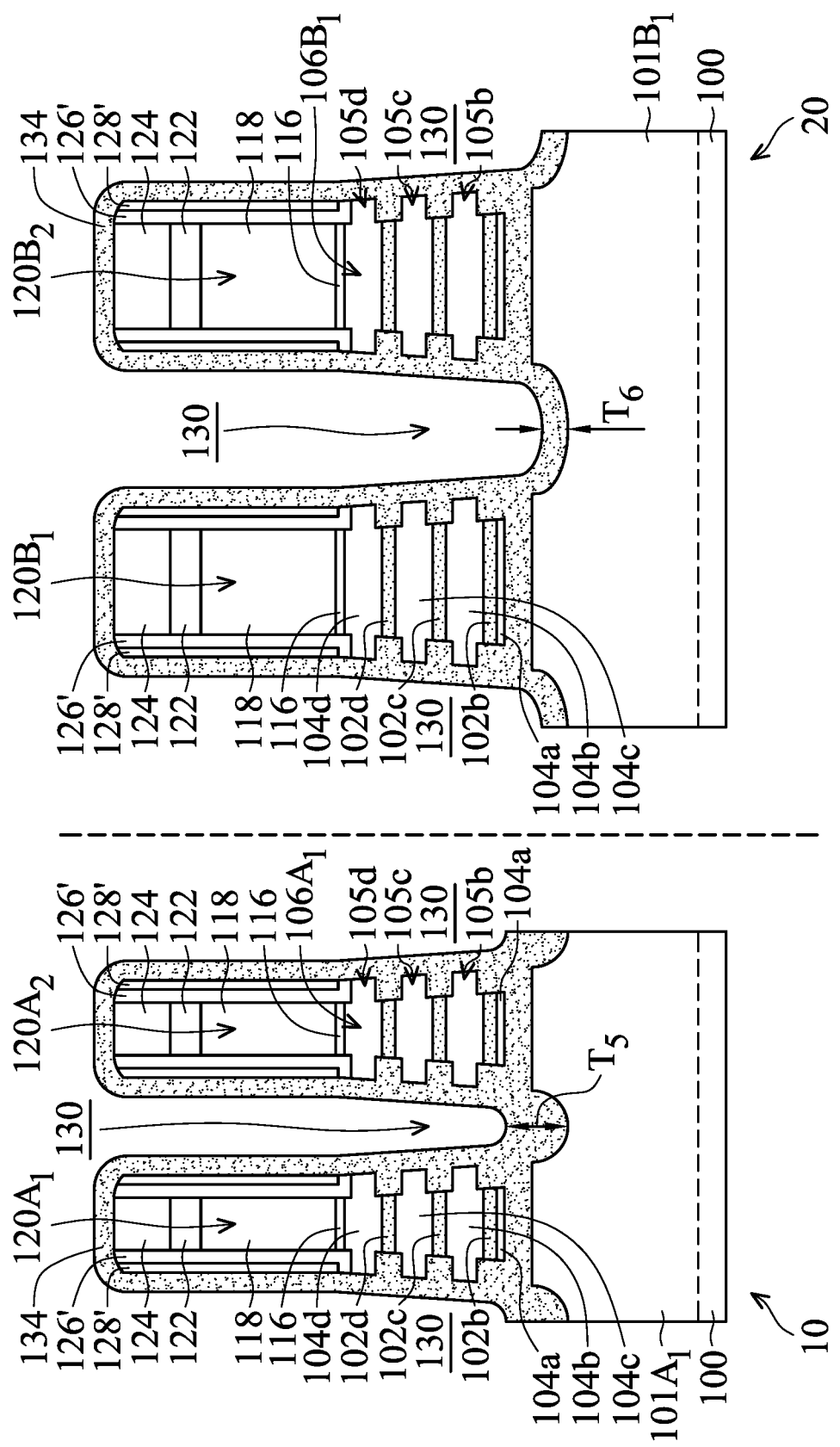

As shown in FIG. 3E, a spacer layer 134 is deposited over the structure shown in FIG. 3D, in accordance with some embodiments. The spacer layer 134 covers the dummy gate stacks 120A$_1$, 120A$_2$, 120B$_1$, and 120B$_2$ and fills the recesses 132 and 133. The spacer layer 134 may be made of or include carbon-containing silicon nitride (SiCN), carbon-containing silicon oxynitride (SiOCN), carbon-containing silicon oxide (SiOC), one or more other suitable materials, or a combination thereof. The spacer layer 134 may be deposited using a CVD process, an ALD process, one or more other applicable processes, or a combination thereof.

As shown in FIG. 3E, the portion of the spacer layer 134 over the first region 10 has a thickness $T_5$ at the bottom of the recess 130, and the portion of the spacer layer 134 over the second region 20 has a thickness $T_6$ at the bottom of the recess 130. In some embodiments, the thickness $T_5$ is greater than the thickness $T_6$. Due to the smaller pitch between the dummy gate stacks over the first region 10, the recess 130 over the first region 10 is narrower than the recess 130 over the second region 20. Therefore, the deposited material used for forming the spacer layer 134 may accumulate at the bottom of the recess 130 over the first region 10 at a higher deposition rate.

Figure 2F:
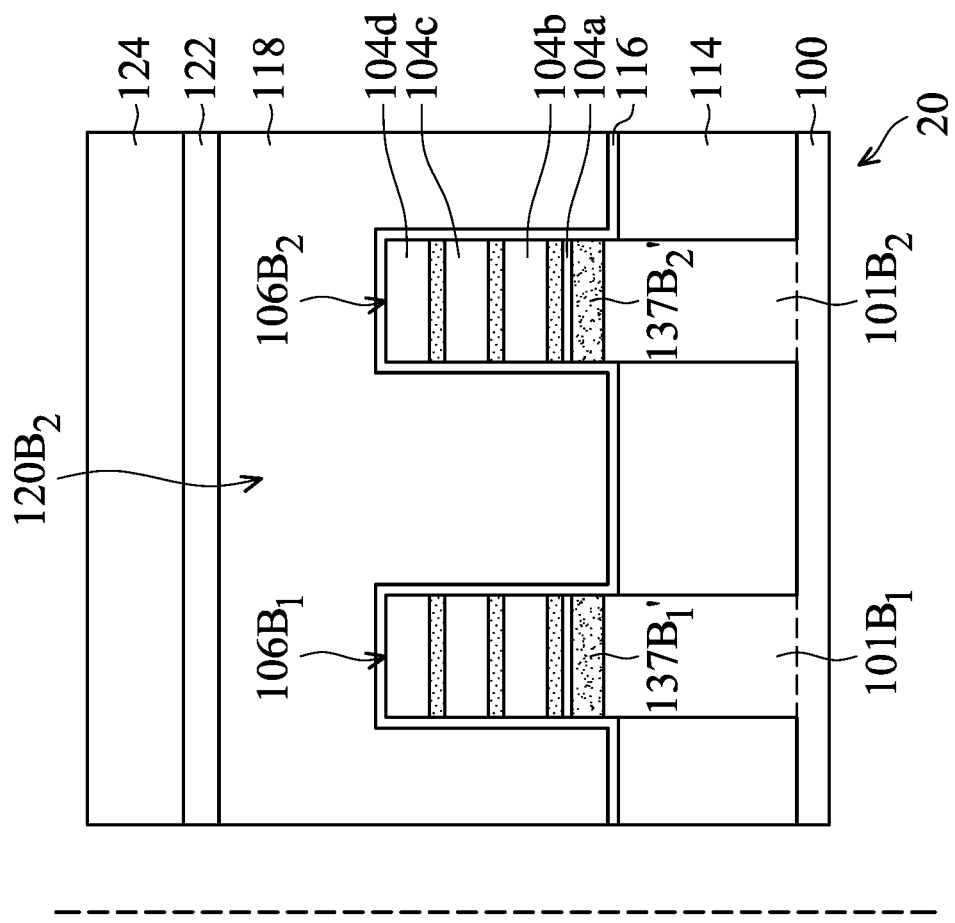
Figure 2F:
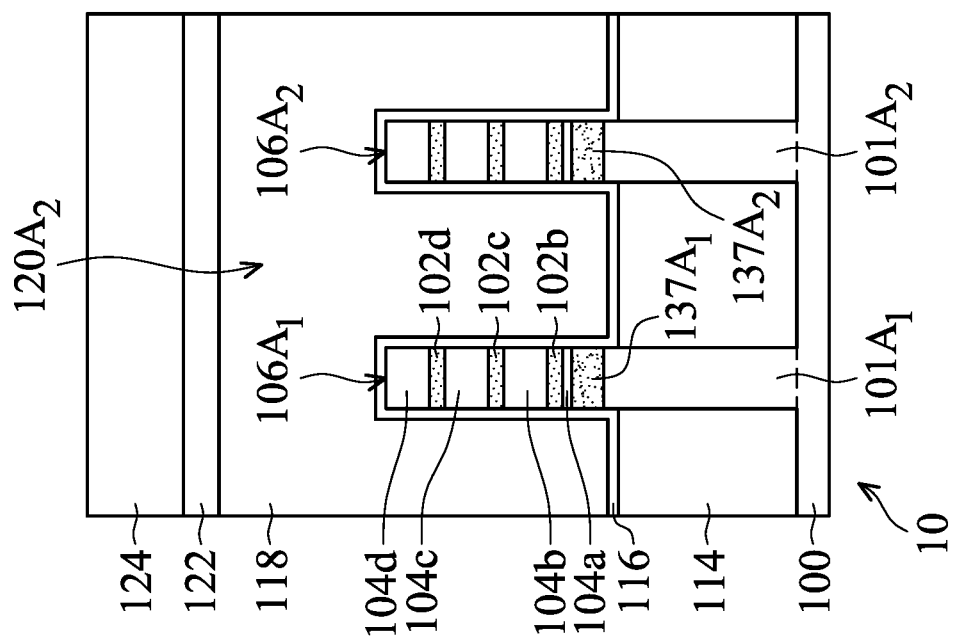
Figure 3F:
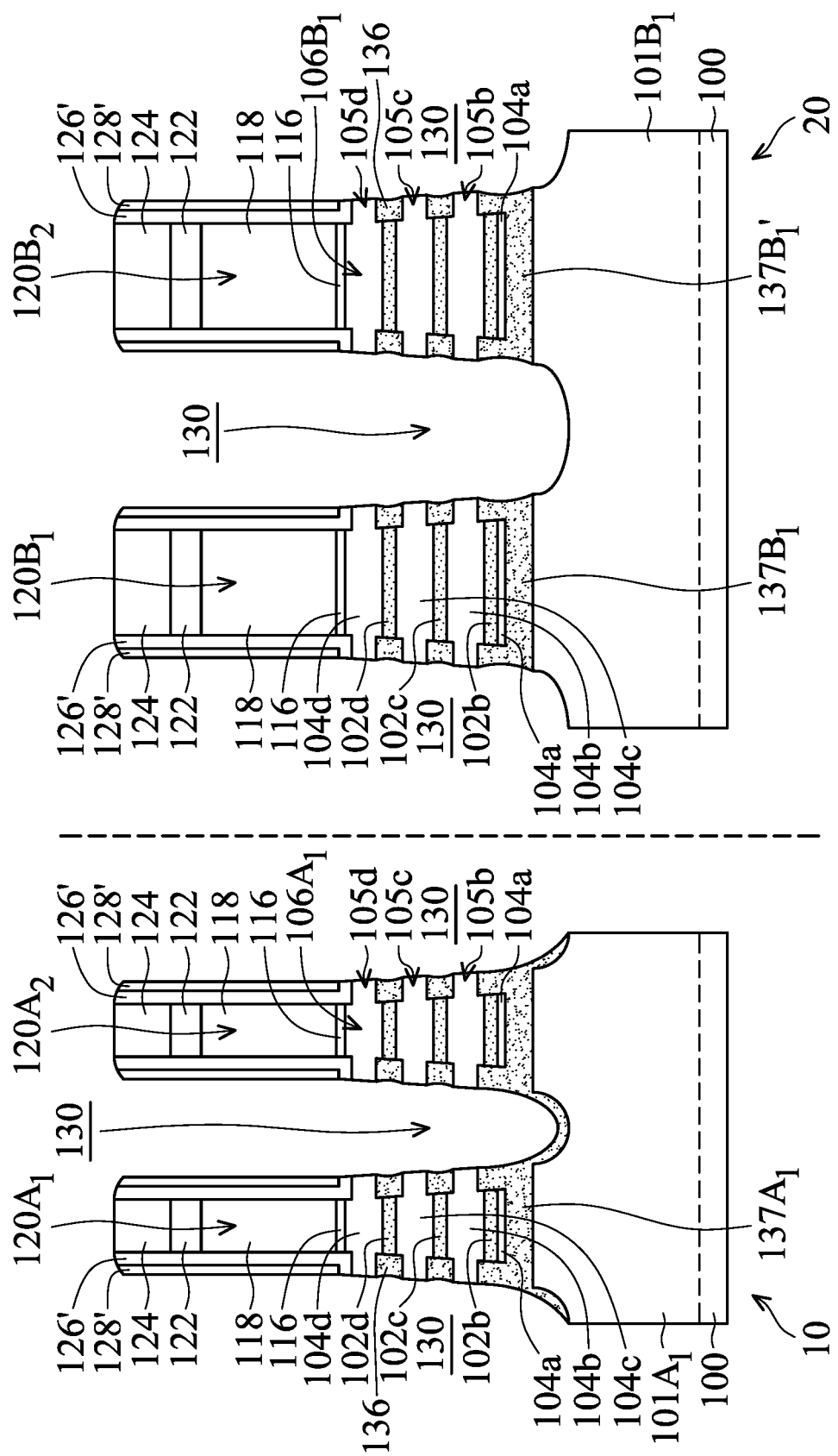

As shown in FIG. 3F, an etching process is used to partially remove the spacer layer 134, in accordance with some embodiments. In some embodiments, first remaining portions of the spacer layer 134 in the recesses 132 form inner spacers 136, as shown in FIG. 3F. In some embodiments, second remaining portions of the spacer layer 134 filling the recesses 133 and filling some of the recesses 132 form isolation structures 137A$_1$, 137A$_2$, 137B$_1$, 137B$_1$', and 137B$_2$', as shown in FIGS. 3F and 2F. In some embodiments, the inner spacers 136 and the isolation structures 137A$_1$, 137A$_2$, 137B$_1$, 137B$_1$', and 137B$_2$' are made of the same material. The etching process used for the partial removal of the spacer layer 134 may include a dry etching process, a wet etching process, or a combination thereof.

The inner spacers 136 and the isolation structures 137A$_1$, 137B$_1$, and 137B$_1$' cover the edges of the semiconductor layers 102b-102d that are originally exposed by the recesses 132, as shown in FIG. 3F. The inner spacers 136 and the isolation structures 137A$_1$, 137B$_1$, and 137B$_1$' may be used to prevent subsequently formed epitaxial structures (that function as, for example, source/drain structures) from being damaged during a subsequent removing process of the semiconductor layers 102b-102d. The inner spacers 136 and the isolation structures 137A$_1$, 137B$_1$, and 137B$_1$' may also be used to reduce parasitic capacitance between the subsequently formed source/drain structures and the gate stacks. The isolation structures 137A$_1$, 137A$_2$, 137B$_1$, 137B$_1$', and 137B$_2$' may help to reduce or prevent current leakage from the subsequently formed epitaxial structures. Therefore, the operation speed and reliability of the semiconductor device structure may be improved.

As illustrated in some embodiments in FIG. 3C, the recesses 130 extend downwards to exceed the top surfaces of the semiconductor fins 101A$_1$ and 101B$_1$, which ensures that the side surfaces of the semiconductor layers 102b-102d are exposed. Therefore, during the lateral etching illustrated in FIG. 3D, each of the semiconductor layers 102b-102d is laterally etched with a sufficient amount. All of the recesses 132 are thus deep enough for containing the inner spacers 136 or portions of the isolation structures 137A$_1$, 137B$_1$, or 137B$_1$'. Each of the inner spacers 136 or the isolation structures 137A$_1$, 137B$_1$, or 137B$_1$' is thus thick enough to provide sufficient protection to the subsequently formed epitaxial structures during a subsequent removing process of the semiconductor layers 102b-102d.

In some embodiments, after the etching process for forming the inner spacers 136, portions of the semiconductor fin 101B$_1$ originally covered by the spacer layer 134 are exposed by the recesses 130, as shown in FIG. 3F. Meanwhile, the semiconductor fin 101A$_1$ remains being covered by isolation structure 137A$_1$ (that is a remaining portion of the spacer layer 134), as shown in FIG. 3F in accordance with some embodiments.

Figure 3G:
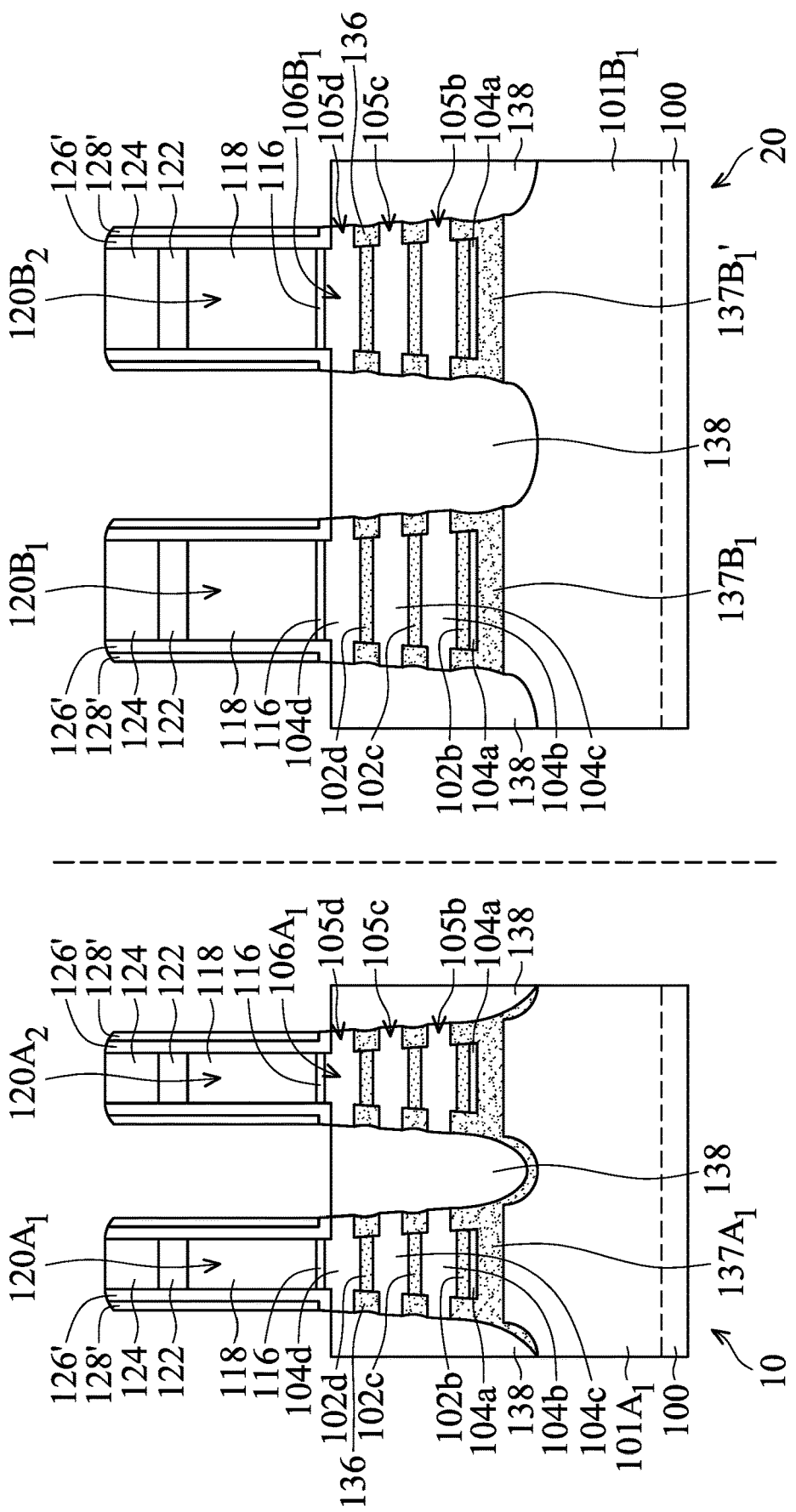

As shown in FIG. 3G, epitaxial structures 138 are formed beside the dummy gate stacks 120A$_1$, 120A$_2$, 120B$_1$, and 120B$_2$, in accordance with some embodiments. In some embodiments, the epitaxial structures 138 fill the recesses 130, as shown in FIG. 3G. In some other embodiments, the epitaxial structures 138 overfill the recesses 130. In these cases, the top surfaces of the epitaxial structures 138 may be higher than the top surface of the dummy gate dielectric layer 116. In some other embodiments, the epitaxial structures 138 partially fill the recesses 130. In some embodiments, the epitaxial structures 138 extend exceeding or past the top surfaces of the semiconductor fins 101A$_1$ and 101B$_1$.

In some embodiments, the epitaxial structures 138 connect to the semiconductor layers 104b-104d. Each of the semiconductor layers 104b-104d is sandwiched between two of the epitaxial structures 138. In some embodiments, the epitaxial structures 138 function as source/drain structures. In some embodiments, some of the epitaxial structures 138 are in direct contact with the semiconductor fin 101B$_1$, as shown in FIG. 3G. In some embodiments, some of the epitaxial structures 138 are separated from the semiconductor fin 101A$_1$ by the isolation structure 137A$_1$, as shown in FIG. 3G. In some embodiments, some of the epitaxial structures 138 are in direct contact with the isolation structure 137A$_1$.

In some embodiments, the epitaxial structures 138 are p-type doped regions. The epitaxial structures 138 may include epitaxially grown silicon germanium (SiGe), epitaxially grown silicon, or another suitable epitaxially grown semiconductor material. In some other embodiments, the epitaxial structures 138 are n-type doped regions. The epitaxial structures 138 may include epitaxially grown silicon, epitaxially grown silicon carbide (SiC), epitaxially grown silicon phosphide (SiP), or another suitable epitaxially grown semiconductor material. In some embodiments, some of the epitaxial structures 138 are p-type doped regions, and other epitaxial structures 138 are n-type doped regions.

In some embodiments, the epitaxial structures 138 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 138 are doped with one or more suitable dopants. For example, the epitaxial structures 138 are SiGe source/drain features or Si source/drain features that are doped with boron (B), gallium (Ga), indium (In), carbon (C), phosphor (P), or another suitable dopant.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

Figure 3H:
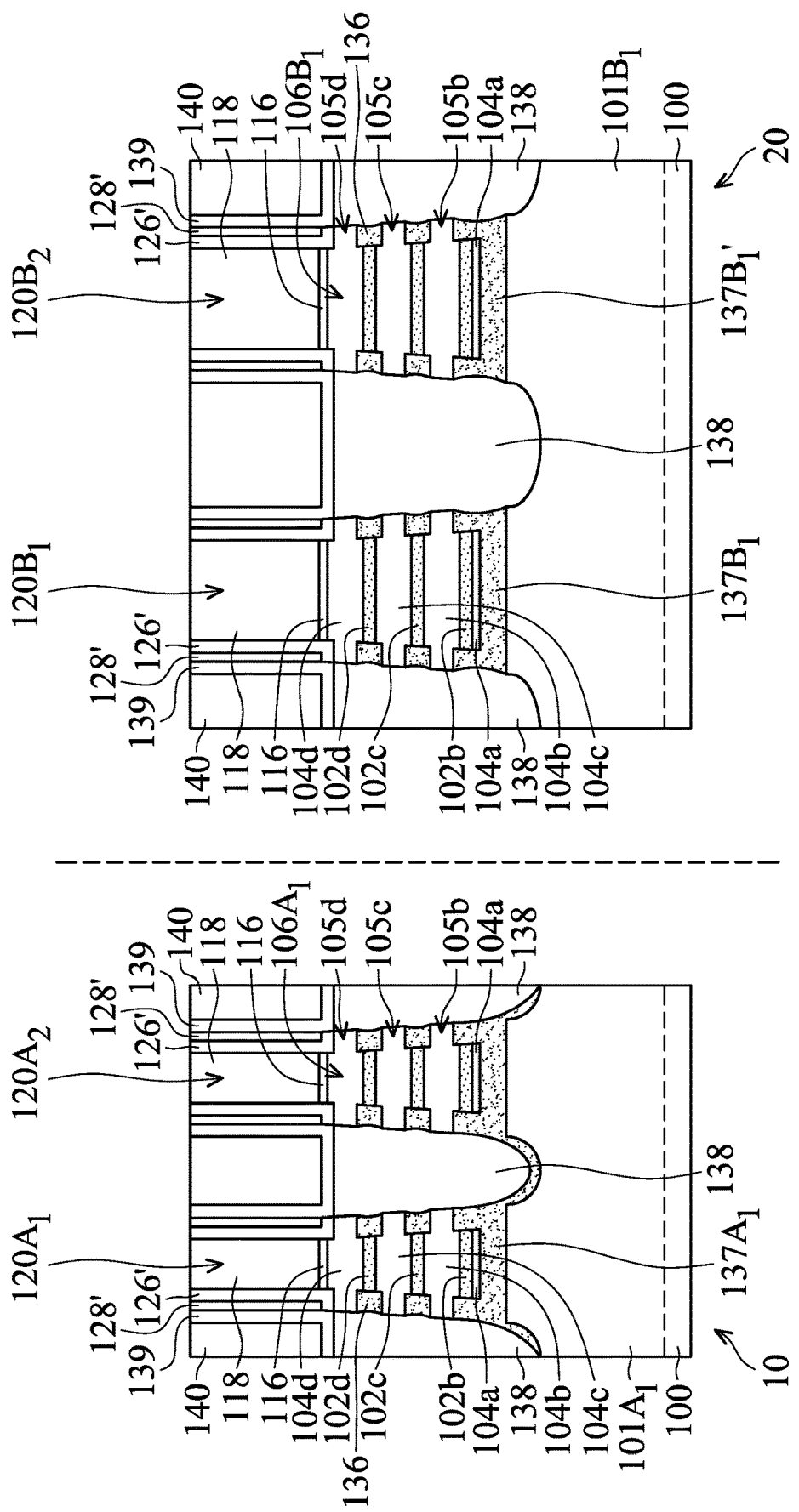

As shown in FIG. 3H, a contact etch stop layer 139 and a dielectric layer 140 are formed to cover the epitaxial structures 138 and to surround the dummy gate stacks 120A$_1$, 120A$_2$, 120B$_1$, and 120B$_2$, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3G. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially coplanar.

Figure 2G:
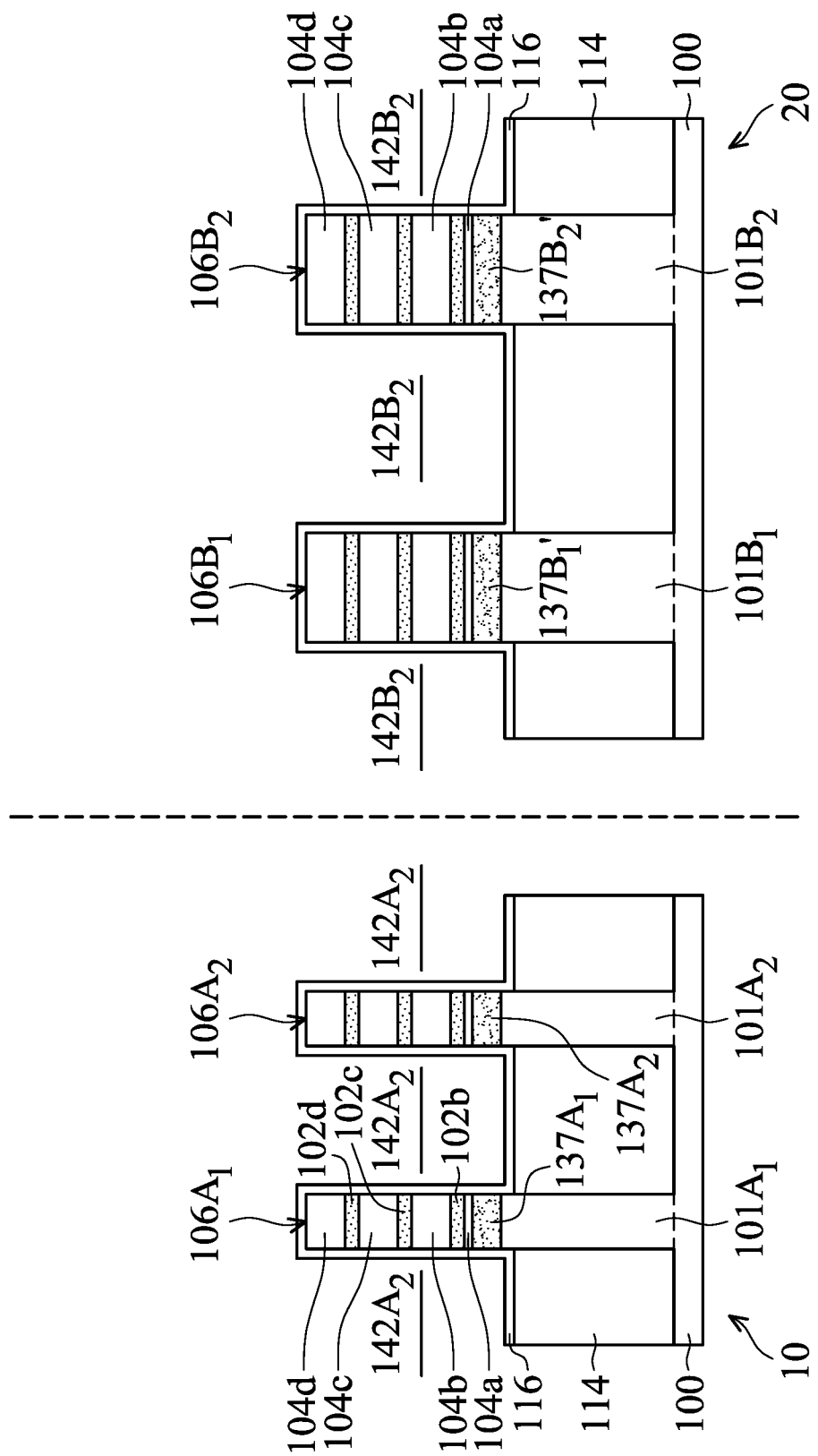
Figure 3I:
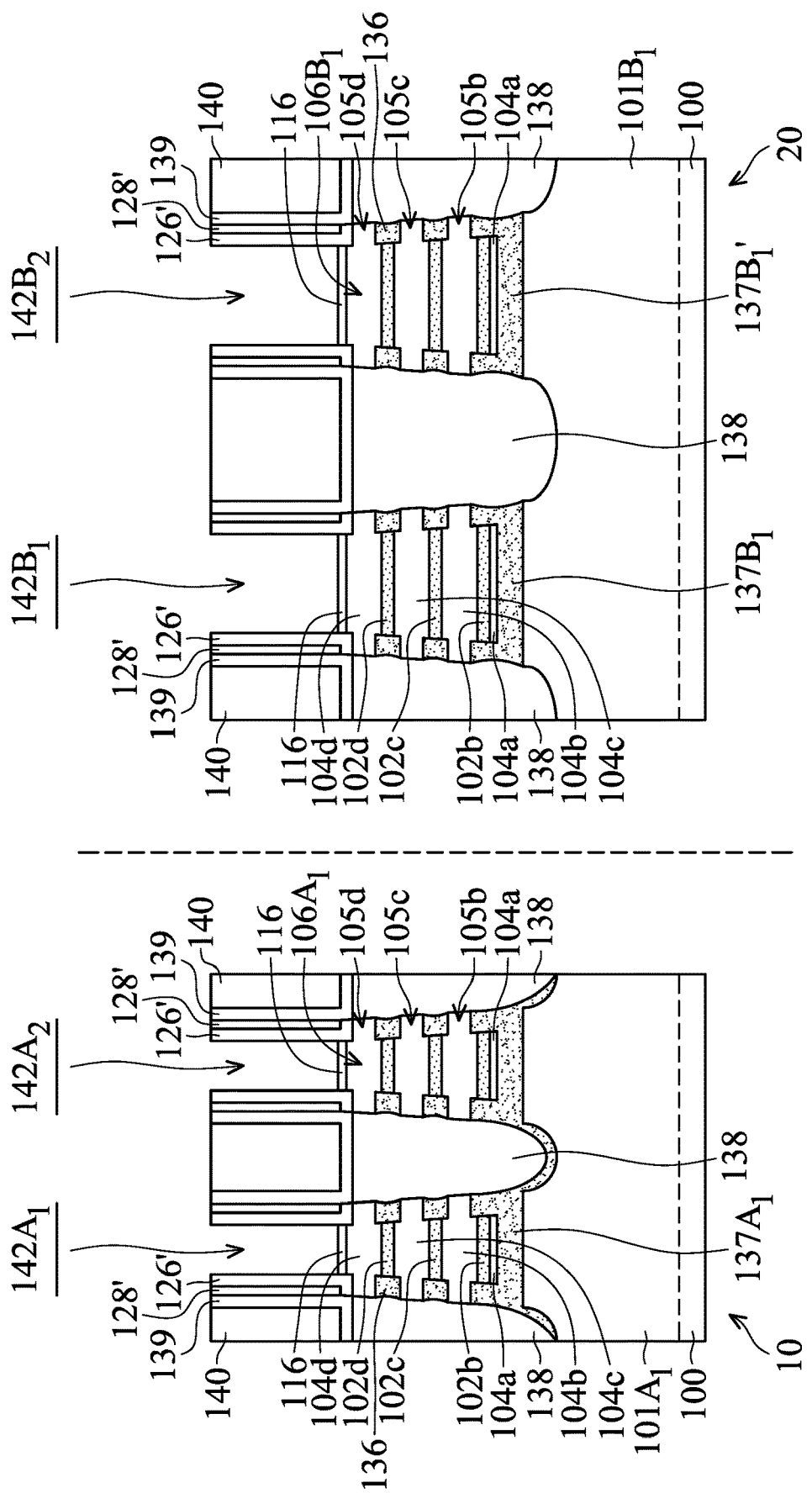

As shown in FIGS. 2G and 3I, the dummy gate electrodes 118 of the dummy gate stacks 120A$_1$, 120A$_2$, 120B$_1$, and 120B$_2$ are removed to form trenches 142A$_1$, 142A$_2$, 142B$_1$, and 142B$_2$, in accordance with some embodiments. The trenches 142A$_1$, 142A$_2$, 142B$_1$, and 142B$_2$ expose the dummy gate dielectric layer 116.

Figure 2H:
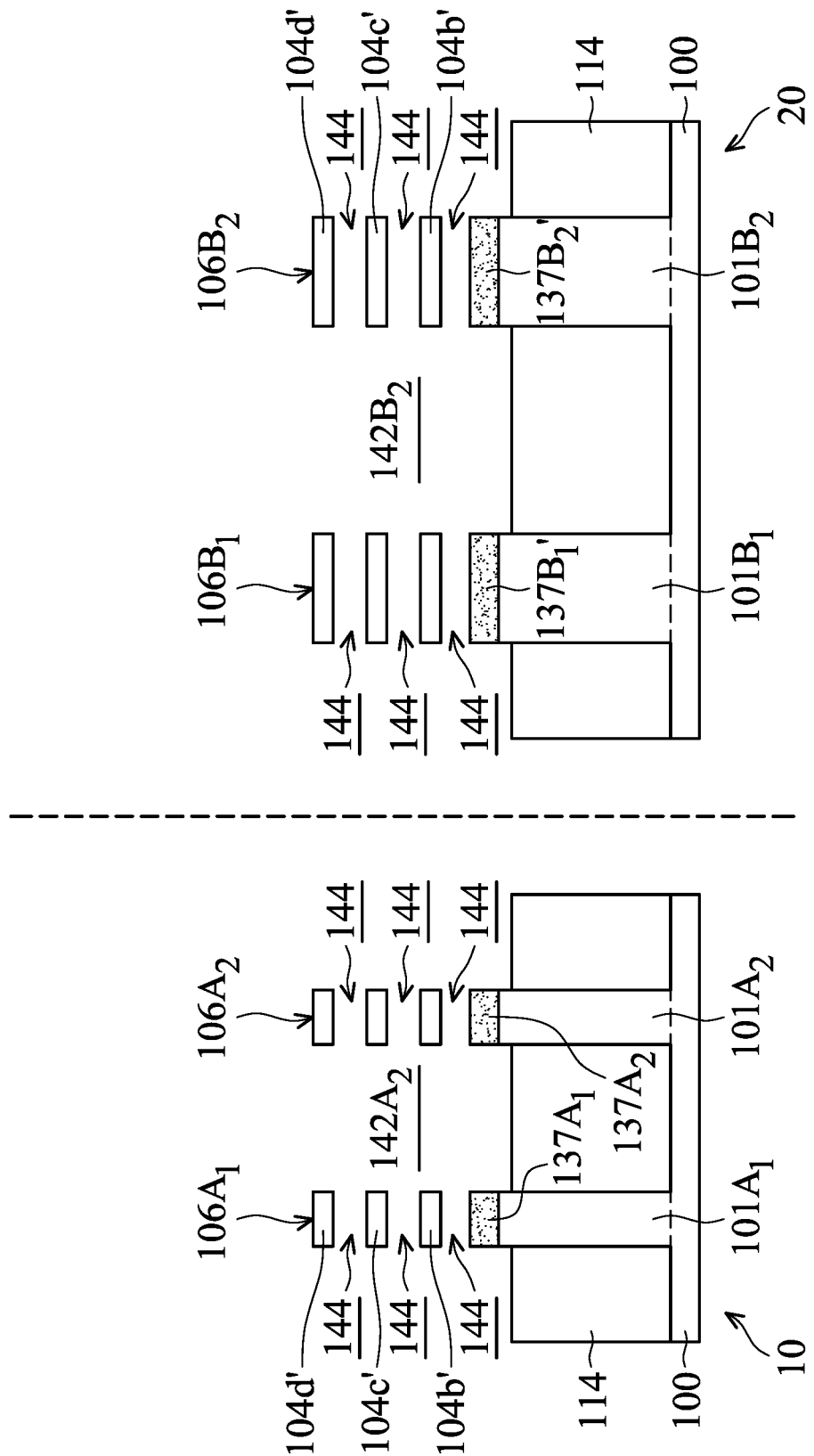
Figure 3J:
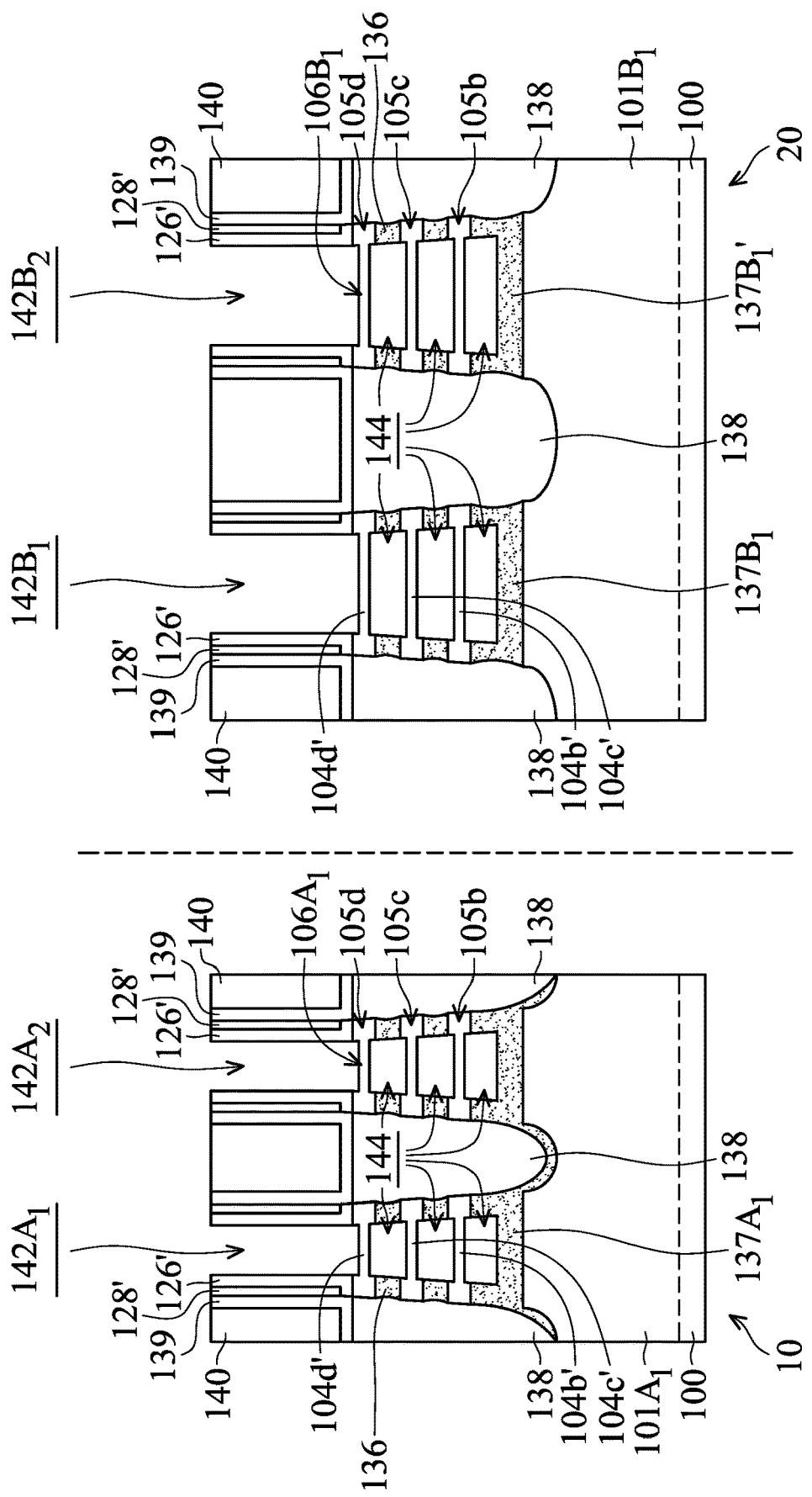

As shown in FIGS. 2H and 3J, the dummy gate dielectric layer 116 and the semiconductor layers 102b-102d (that function as sacrificial layers) are removed to form recesses 144, in accordance with some embodiments. In some embodiments, an etching process is used to remove the semiconductor layers 102b-102d. Due to high etching selectivity, the semiconductor layers 104b-104d are slightly (or substantially not) etched. The remaining portions of the semiconductor layers 104b-104d form multiple semiconductor nanostructures 104b'-104d' of the fin structures 106A$_1$, 106A$_2$, 106B$_1$ and 106B$_2$, as shown in FIGS. 2H and 3J. The semiconductor nanostructures 104b'-104d' are constructed by or made up of the remaining portions of the semiconductor layer 104b-104d. The semiconductor nanostructures 104b'-104d' suspended over the semiconductor fin 101A$_1$, 101A$_2$, 101B$_1$ or 101B$_2$ may function as channel structures of transistors.

As mentioned above, in some embodiments, the etchant used for removing the semiconductor layers 102b-102d also slightly removes the semiconductor layers 104b-104d that form the semiconductor nanostructures 104b'-104d'. As a result, the obtained semiconductor nanostructures 104b'-104d' become thinner after the removal of the semiconductor layers 102b-102d. In some embodiments, each of the semiconductor nanostructures 104b'-104d' is thinner than the edge portions 105b-105d, as shown in FIG. 3J. The edge portions 105b-105d are surrounded by other elements and thus are prevented from being reached and etched by the etchant.

In some embodiments, the etchant used for removing the semiconductor layers 102b-102d etches through the semiconductor layer 104a that is thinner than the semiconductor layer 104b, 104c, or 104d. As a result, the isolation structures 137A$_1$, 137A$_2$, 137B$_1$, 137B$_1$', and 137B$_2$' are exposed.

As mentioned above, after the removal of the semiconductor layers 102b-102d (that function as sacrificial layers), recesses 144 are formed. The recesses 144 connect to the trenches 142A$_1$, 142A$_2$, 142B$_1$, and 142B$_2$ and surround each of the semiconductor nanostructures 104b'-104d'. As shown in FIG. 3J, even if the recesses 144 between the semiconductor nanostructures 104b'-104d' are formed, the semiconductor nanostructures 104b'-104d' remain being held by the epitaxial structures 138. Therefore, after the removal of the semiconductor layers 102b-102d (that function as sacrificial layers), the released semiconductor nanostructures 104b'-104d' are prevented from falling down.

During the removal of the semiconductor layers 102b-102d (that function as sacrificial layers), the inner spacers 136 and the isolation structures 137A$_1$, 137B$_1$, and 137B$_1$' protect the epitaxial structures 138 from being etched or damaged. The quality and reliability of the semiconductor device structure are ensured.

As mentioned above, in some embodiments as illustrated in FIG. 2A, the ratio (T$_1$/T$_2$) of the thickness T$_1$ of the semiconductor layer 104a (that afterwards functions as a protective layer to the semiconductor layer 102b during the process illustrated in FIGS. 2E and 3D) to the thickness T$_2$ of the semiconductor layer 104b (that afterwards becomes the nanostructure 104b') may be in a range from about 2/5 to about 2/3. In some cases, if the thickness ratio (T$_1$/T$_2$) is lower than about 2/5, the semiconductor layer 104a with the thickness T$_1$ may be too thin. As a result, during the removal of the semiconductor layer 102a (which function as sacrificial base layer) as illustrated in FIGS. 2E and 3D, the semiconductor layer 104a may be broken or completely removed, exposing the semiconductor layer 102b above it to the etchant. The semiconductor layer 102b may be damaged or removed. As a result, the spacer layer 134 that are formed later may occupy the space that is designed to contain the semiconductor layer 102b. The subsequent processes may become hard to perform.

In some other cases, if the thickness ratio (T$_1$/T$_2$) is greater than about 2/3, the semiconductor layer 104a with the thickness T$_1$ may be too thick. As a result, for removing the semiconductor layer 104a, additional or heavier etching process may need to be used in the process illustrated in FIGS. 2H and 3J. The process time may become longer. The additional or heavier etching process may also damage other elements (such as the channel structures) that have been formed. The performance and reliability of the semiconductor device structure might be at a risk of being negatively affected.

Figure 2I:
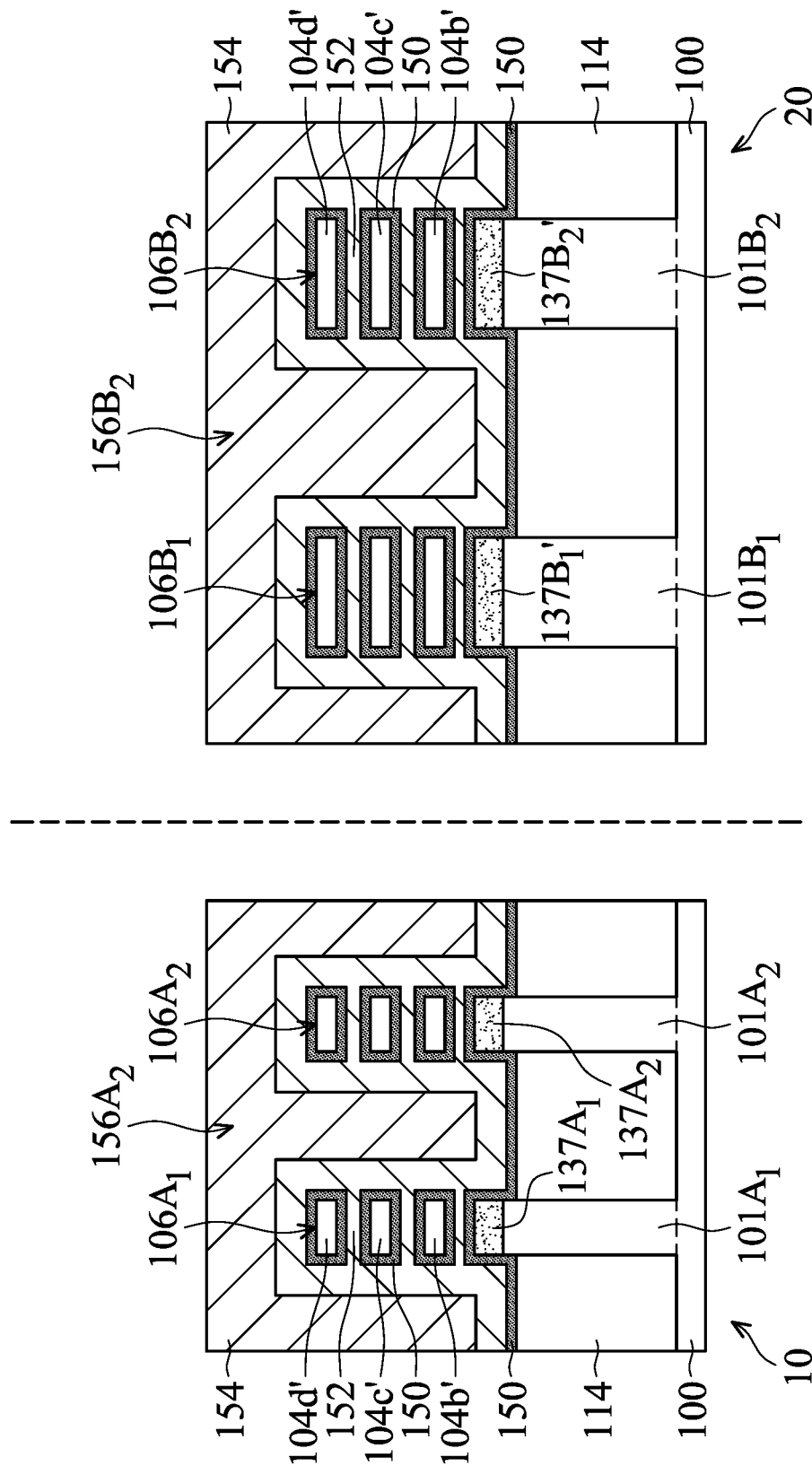
Figure 3K:
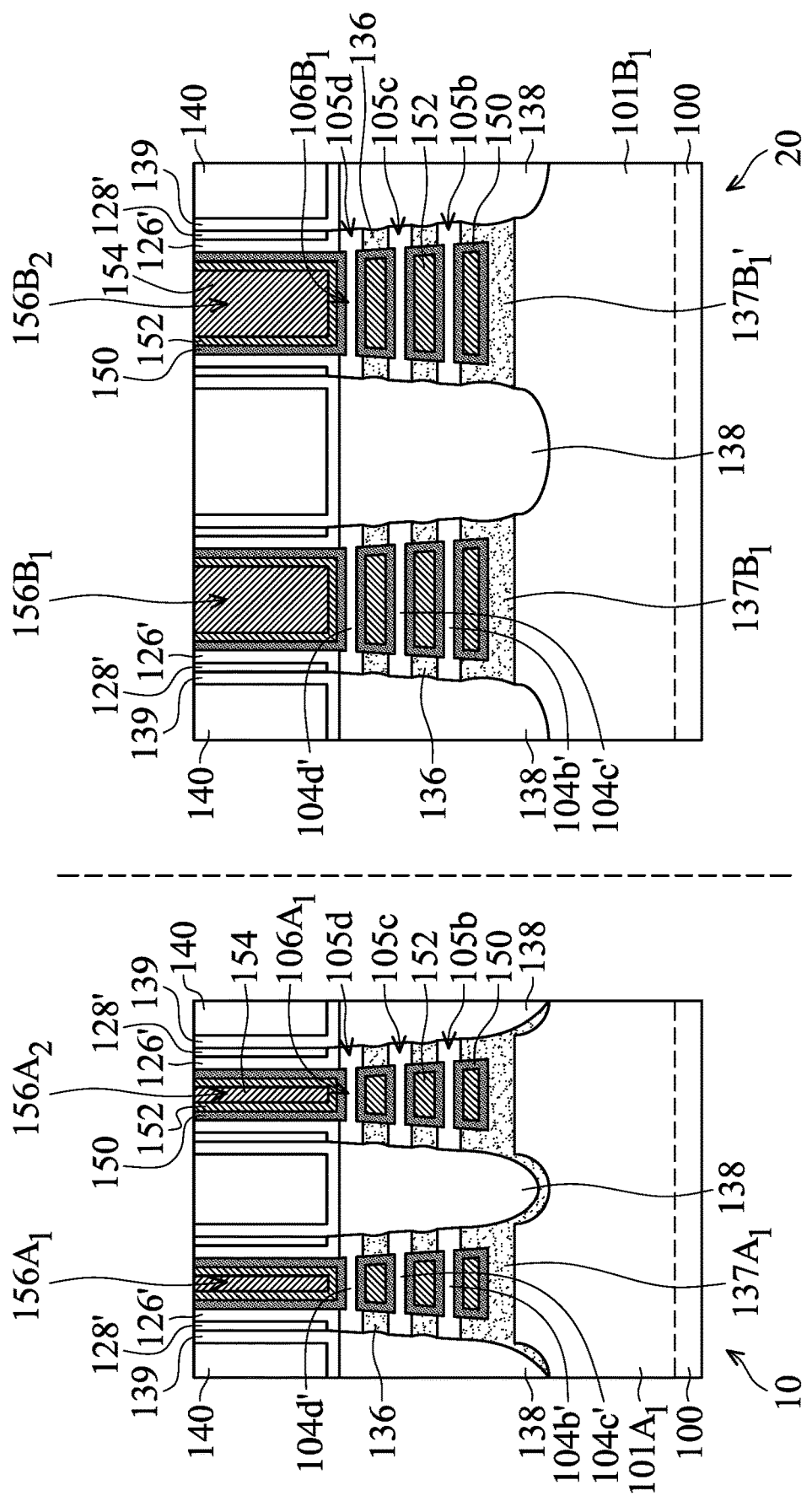

As shown in FIGS. 2I and 3K, metal gate stacks 156A$_1$, 156A$_2$, 156B$_1$, and 156B$_2$ are formed to fill the trenches 142A$_1$, 142A$_2$, 142B$_1$, and 142B$_2$, in accordance with some embodiments. The metal gate stacks 156A$_1$, 156A$_2$, 156B$_1$, and 156B$_2$ extend into the recesses 144 to wrap around each of the semiconductor nanostructures 104b'-104d'. In some embodiments, each of the isolation structures 137A$_1$, 137A$_2$, 137B$_1$, 137B$_1$', and 137B$_2$' is in direct contact with the corresponding semiconductor fin 101A$_1$, 101A$_2$, 101B$_1$ or 101B$_2$, the corresponding epitaxial structure 138, and/or the corresponding metal gate stack 156A$_1$, 156A$_2$, 156B$_1$, and 156B$_2$, as shown in FIGS. 2I and 3K.

Each of the metal gate stacks 156A$_1$, 156A$_2$, 156B$_1$, and 156B$_2$ includes multiple metal gate stack layers. Each of the metal gate stacks 156A$_1$, 156A$_2$, 156B$_1$, and 156B$_2$ may include a gate dielectric layer 150, a work function layer 152, and a conductive filling 154. In some embodiments, the formation of the metal gate stacks 156A$_1$, 156A$_2$, 156B$_1$, and 156B$_2$ involves the deposition of multiple metal gate stack layers over the dielectric layer 140 to fill the trenches 142A$_1$, 142A$_2$, 142B$_1$, and 142B$_2$ and the recesses 144. The metal gate stack layers extend into the recesses 144 to wrap around each of the semiconductor nanostructures 104b'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104b'-104d'. The interfacial layers are very thin and are made of, for example, silicon oxide or germanium oxide. In some embodiments, the interfacial layers are formed by applying an oxidizing agent on the surfaces of the semiconductor nanostructures 104b'-104d'. For example, a hydrogen peroxide-containing liquid may be applied or provided on the surfaces of the semiconductor nanostructures 104b'-104d' so as to form the interfacial layers.

The work function layer 152 may be used to provide the desired work function for transistors to enhance device performance including improved threshold voltage. In some embodiments, the work function layer 152 is used for forming an NMOS device. The work function layer 152 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function layer is an aluminum-containing layer. The aluminum-containing layer may be made of or include TiAlC, TiAlO, TiAlN, one or more other suitable materials, or a combination thereof.

In some other embodiments, the work function layer 152 is used for forming a PMOS device. The work function layer 152 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

The work function layer 152 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 152 may be fine-tuned to adjust the work function level.

The work function layer 152 may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer 152 to interface the gate dielectric layer 150 with the subsequently formed work function layer 152. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 154 are made of or include a metal material. The metal material may include tungsten, aluminum, copper, cobalt, one or more other suitable materials, or a combination thereof. A conductive layer used for forming the conductive filling 154 may be deposited over the work function layer 152 using a CVD process, an ALD process, a PVD process, an electroplating process, an electroless plating process, a spin coating process, one or more other applicable processes, or a combination thereof.

In some embodiments, a blocking layer is formed over the work function layer 152 before the formation of the conductive layer used for forming the conductive filling 154. The blocking layer may be used to prevent the subsequently formed conductive layer from diffusing or penetrating into the work function layer 152. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142A$_1$, 142A$_2$, 142B$_1$, and 142B$_2$, in accordance with some embodiments. As a result, the remaining portions of the metal gate stack layers form the metal gate stacks 156A$_1$, 156A$_2$, 156B$_1$, and 156B$_2$, as shown in FIGS. 2I and 3K.

In some embodiments, the conductive filling 154 does not extend into the recesses 144 since the recesses 144 are small and have been filled with other elements such as the gate dielectric layer 150 and the work function layer 152. However, embodiments of the disclosure are not limited thereto. In some other embodiments, a portion of the conductive filling 154 extends into the recesses 144, especially for the lower recesses 144 that may have larger space.

As shown in FIG. 3K, the isolation structure 137A$_1$ extends exceeding opposite sidewalls of one of the epitaxial structures 138 (such as the middle one), in accordance with some embodiments. In some embodiments, the isolation structure 137A$_1$ further extends along the bottom of the epitaxial structures 138. In some embodiments, the entirety of the epitaxial structure 138 is above the bottom surface of the isolation structure 137A$_1$. In some embodiments, the isolation structure 137A$_1$ further extends between the semiconductor fin 101A$_1$ and the metal gate stack 156A$_2$. In some embodiments, the isolation structure 137A$_1$ is in direct contact with the bottom of the epitaxial structures 138.

Due to the isolation structure 137A$_1$, leakage current from the epitaxial structure 138 may be blocked by the isolation structure 137A$_1$. Current leakage between the epitaxial structures 138 through the semiconductor fin and/or the semiconductor substrate 100 is thus prevented. The isolation structure 137A$_1$ may also help to reduce parasitic capacitance between the epitaxial structure 138 and the metal gate stack 156A$_1$ or 156A$_2$. Therefore, the operation speed and reliability of the semiconductor device structure may be improved.

As shown in FIG. 3K, each of the metal gate stacks 156B$_1$ and 156B$_2$ wraps around multiple semiconductor nanostructures 104b'-104d', in accordance with some embodiments. Each of the metal gate stacks 156B$_1$ and 156B$_2$ is wider than each of the metal gate stacks 156A$_1$ and 156A$_2$. In some embodiments, each of the semiconductor nanostructures 104b'-104d' that are wrapped around by the metal gate stacks 156B$_1$ or 156B$_2$ is wider than each of the semiconductor nanostructures 104b'-104d' that are wrapped around by the metal gate stacks 156A$_1$ or 156A$_2$, as shown in FIG. 3K.

The device formed over the second region 20 may be a long channel (LC) device. In some embodiments, the isolation structures 137B$_1$ and 137B$_1$' are separated from each other by one of the epitaxial structures 138, as shown in FIG. 3K. In some embodiments, the epitaxial structures 138 extend exceeding the bottom surfaces of the isolation structures 137B$_1$ and 137B$_1$', as shown in FIG. 3K. In some embodiments, the epitaxial structures 138 are in direct contact with the semiconductor fin 101B$_1$. Current leakage between the epitaxial structures 138 through the semiconductor fin 101B$_1$ and/or the semiconductor substrate 100 may not occur since the epitaxial structures 138 over the second region 20 are separated from each other by a longer distance.

As mentioned above, in some embodiments, the ratio ($T_3/T_4$) of the thickness $T_3$ of the semiconductor layer 102a to the thickness $T_4$ of the semiconductor layer 102b is in a range from about 1 to about 2. In some cases, if the thickness ratio ($T_3/T_4$) is smaller than about 1, the semiconductor layer 102a may be too thin. In the process illustrated in FIG. 3D, the semiconductor layer 102a may not be able to be etched at a sufficient etching rate, which might make the subsequent processes hard to perform. In some other cases, if the thickness ratio ($T_3/T_4$) is greater than about 2, the semiconductor layer 102a may be too thick. As a result, the recesses 133 illustrated in FIG. 3D or 2E may thus be too large. The spacer layer 134 illustrated in FIG. 3E may not be able to merge together. As a result the obtained isolation structures may have too many voids and/or seams, which might increase the risk of current leakage.

In some embodiments, the semiconductor layer 102a (that functions as a sacrificial base layer) is completely removed during the formation of the recesses 132 used for containing the inner spacers 136, as shown in FIGS. 3C-3F. However, embodiments of the disclosure are not limited thereto. Many variations and/or modifications can be made to embodiments of the disclosure. In some other embodiments, the semiconductor layer 102a is partially removed without being completely removed during the formation of the recesses 132.

Figure 4A:
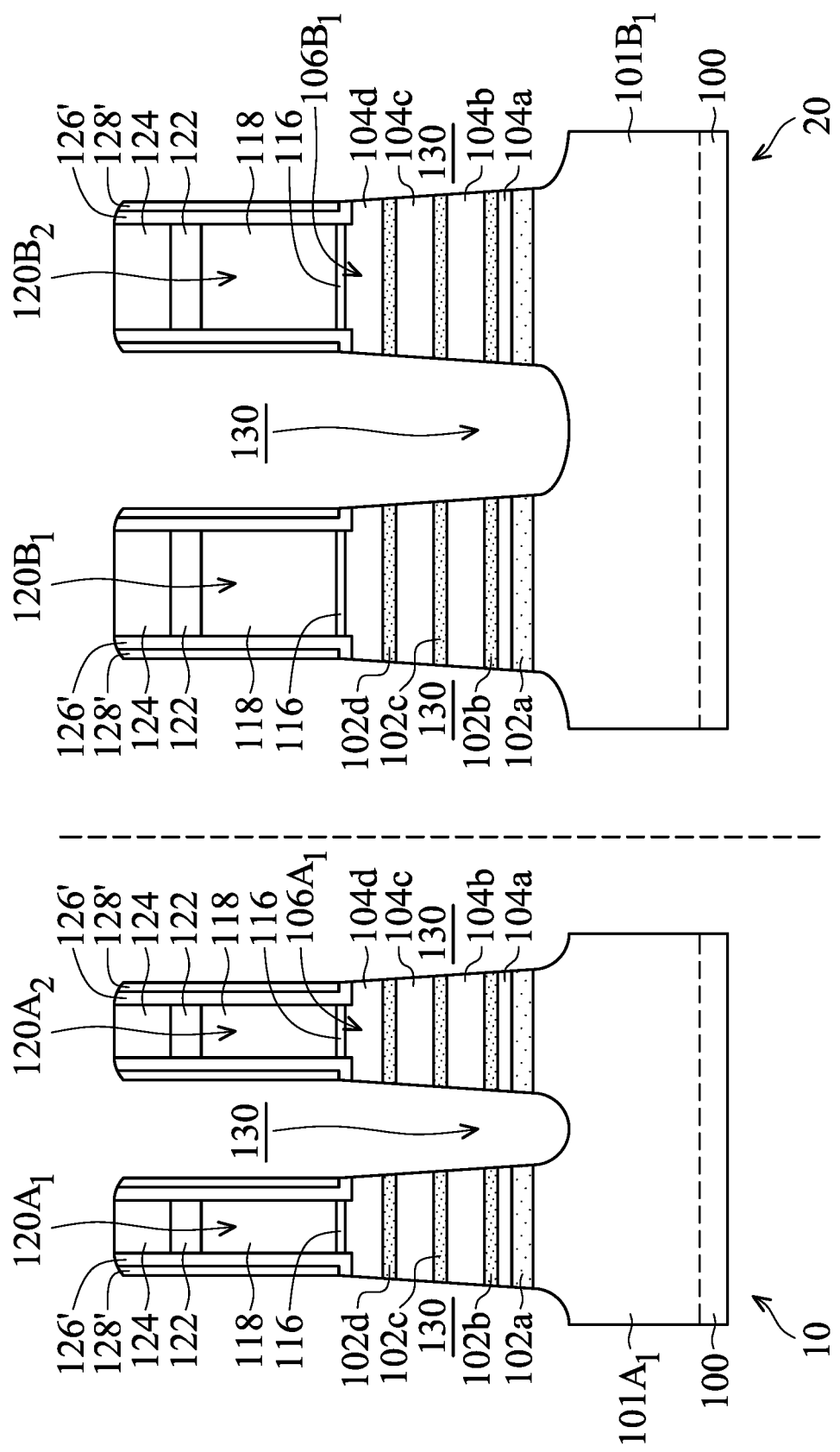
FIGS. 4A-4E are cross-sectional views of various stages of a process for forming a semiconductor device structure, in accordance with some embodiments.

FIGS. 4A-4E are cross-sectional views of various stages of a process for forming a semiconductor device structure, in accordance with some embodiments. As shown in FIG. 4A, a structure the same as or similar to that shown in FIG. 3C is formed or received.

Figure 4B:
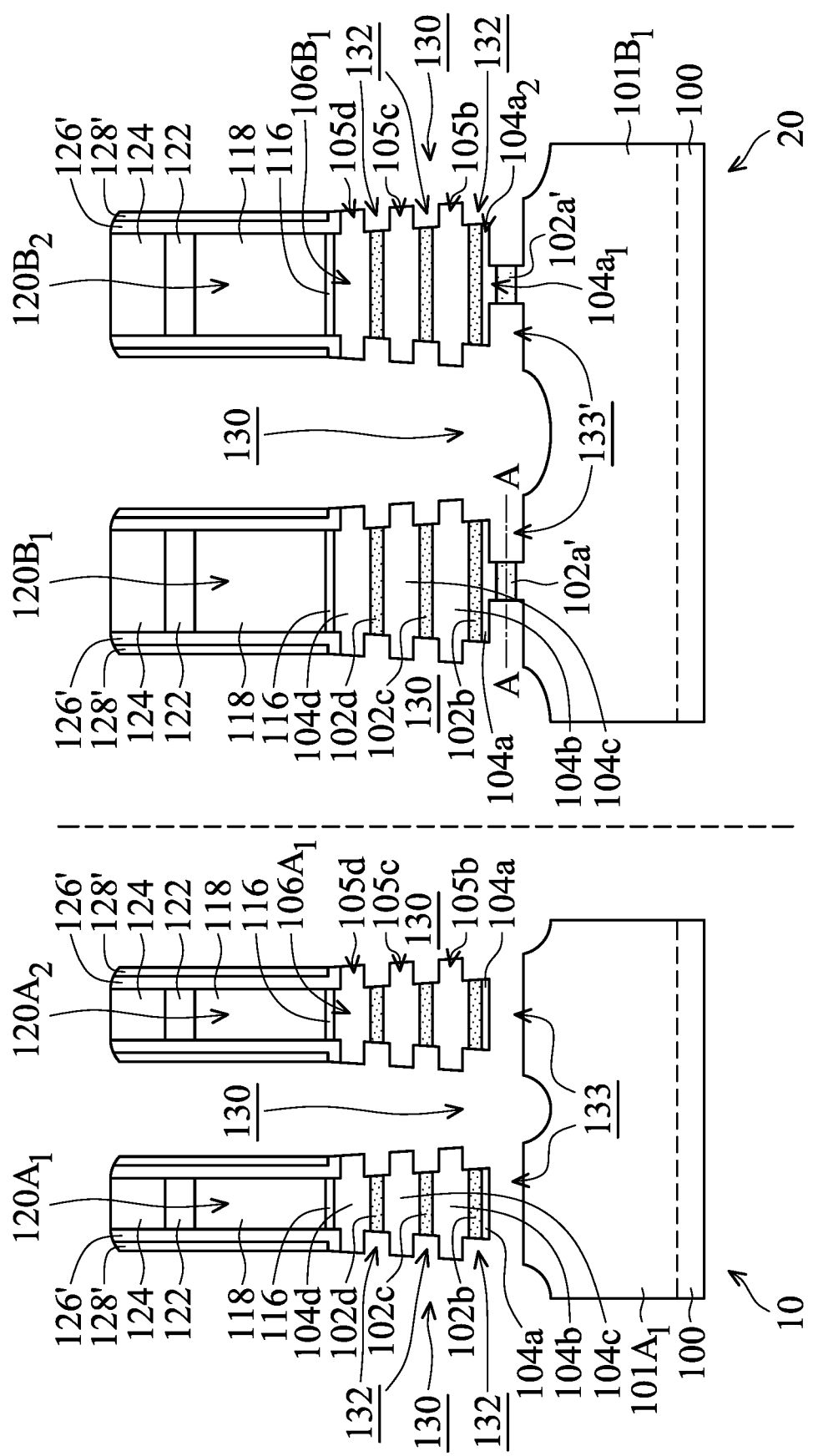

As shown in FIG. 4B, similar to the embodiments illustrated in FIG. 3D, the semiconductor layers 102b-102d are laterally etched to form recesses 132, in accordance with some embodiments. In some embodiments, similar to the embodiments illustrated in FIG. 3D, the portions of the semiconductor layer 102a under the dummy gate stacks 120A$_1$ and 120A$_2$ are completely removed to form the recesses 133. In some embodiments, the portions of the semiconductor layer 102a under the dummy gate stacks 120B$_1$ and 120B$_2$ are partially removed without being completely removed, as shown in FIG. 4B. The remaining portions of the semiconductor layer 102a form remaining structures 102a' that are surrounded by recesses 133', as shown in FIG. 4B.

As shown in FIG. 4B, the semiconductor layer 104a over the second region 20 has a first portion 104a$_1$ and a second portion 104a$_2$. The first portion 104a$_1$ is directly above the remaining structure 102a' and thus is prevented from being etched during the formation of the recesses 132. Therefore, in some embodiments, the first portion 104a$_1$ is thicker than the second portion 104a$_2$.

Figure 5A:
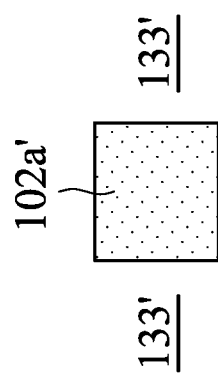
FIGS. 5A-5C are cross-sectional views of various stages of a process for forming a semiconductor device structure, in accordance with some embodiments.
Figure 5B:
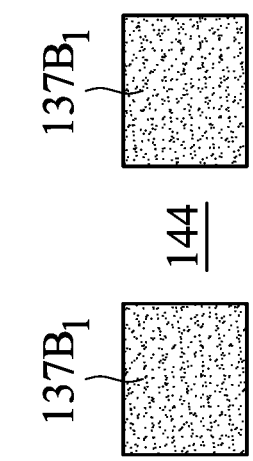
Figure 5C:
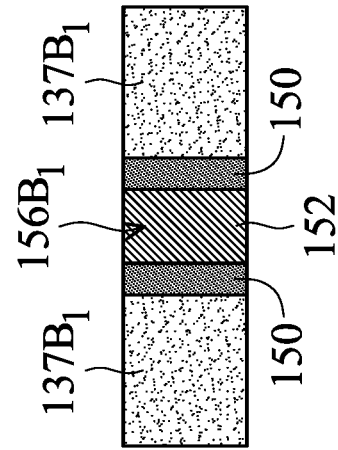
Figure 6A:
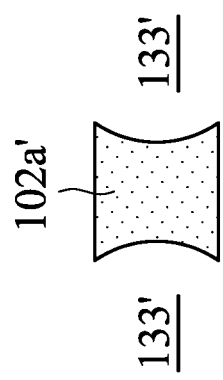
FIGS. 6A-6C are cross-sectional views of various stages of a process for forming a semiconductor device structure, in accordance with some embodiments.
Figure 6B:
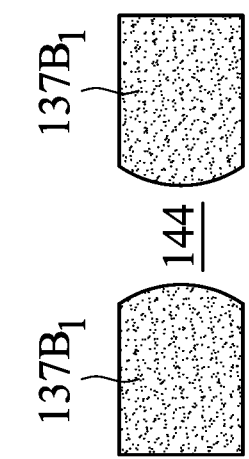
Figure 6C:
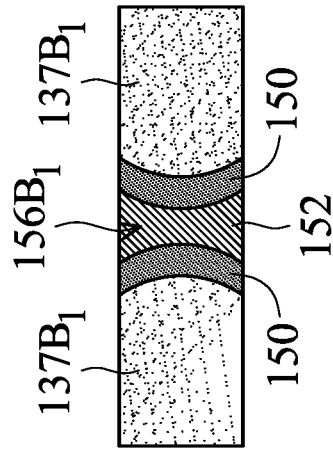

FIGS. 5A-5C are cross-sectional views (or plane views) of various stages of a process for forming a semiconductor device structure, in accordance with some embodiments. In some embodiments, FIG. 5A is a cross-sectional view (or a plane view) of the structure taken along the line A-A in FIG. 4B. FIGS. 6A-6C are cross-sectional views (or plane views) of various stages of a process for forming a semiconductor device structure, in accordance with some embodiments. In some embodiments, FIG. 6A is a cross-sectional view (or a plane view) of the structure taken along the line A-A in FIG. 4B.

In some embodiments, the remaining structure 102a' has substantially straight edges, as shown in FIG. 5A. In some other embodiments, the remaining structure 102a' has curved edges, as shown in FIG. 6A.

Figure 4C:
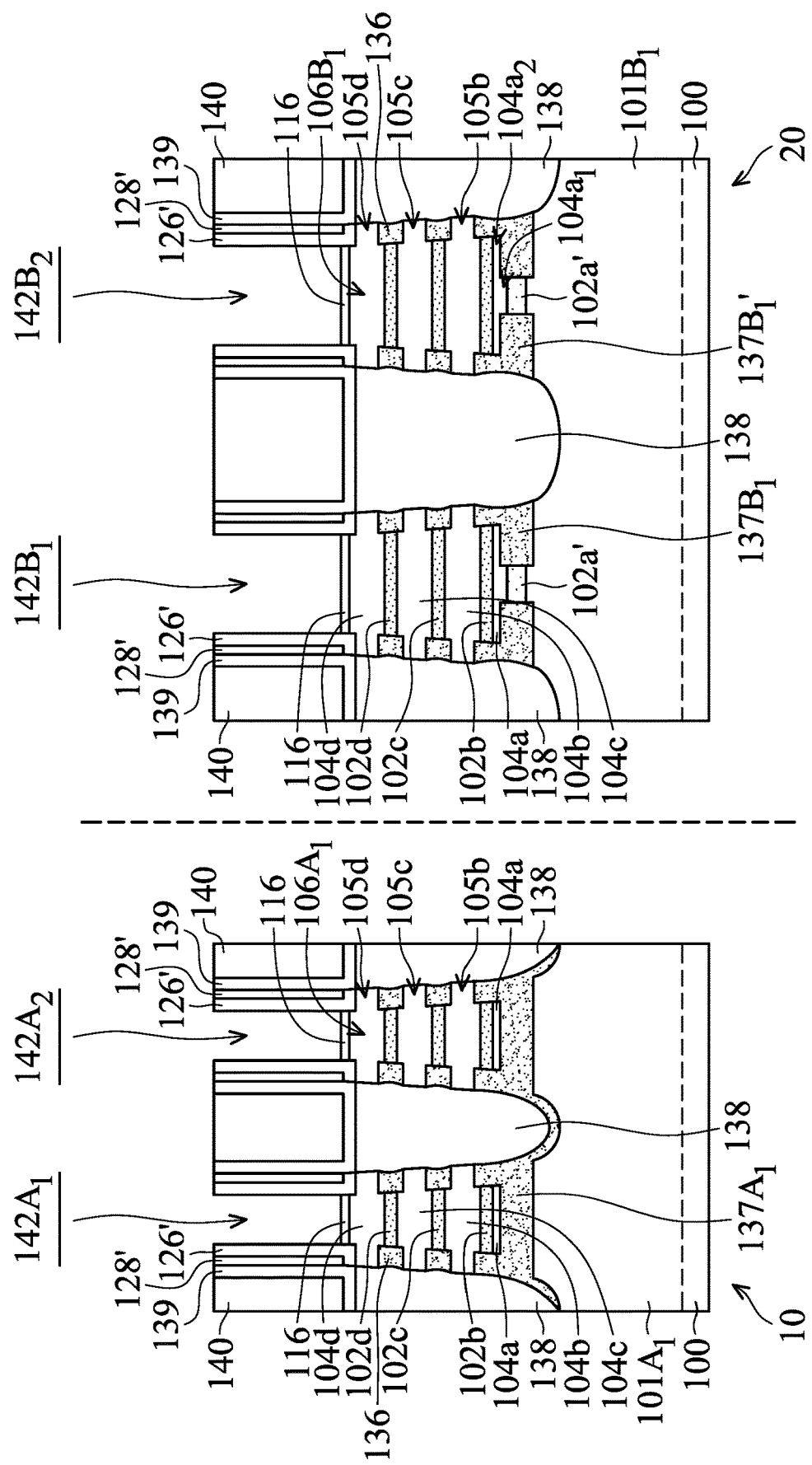

Afterwards, the processes the same as or similar to those illustrated in FIGS. 3E-3I are performed to the structure shown in FIG. 4B, in accordance with some embodiments. As a result, the structure shown in FIG. 4C is formed.

Figure 4D:
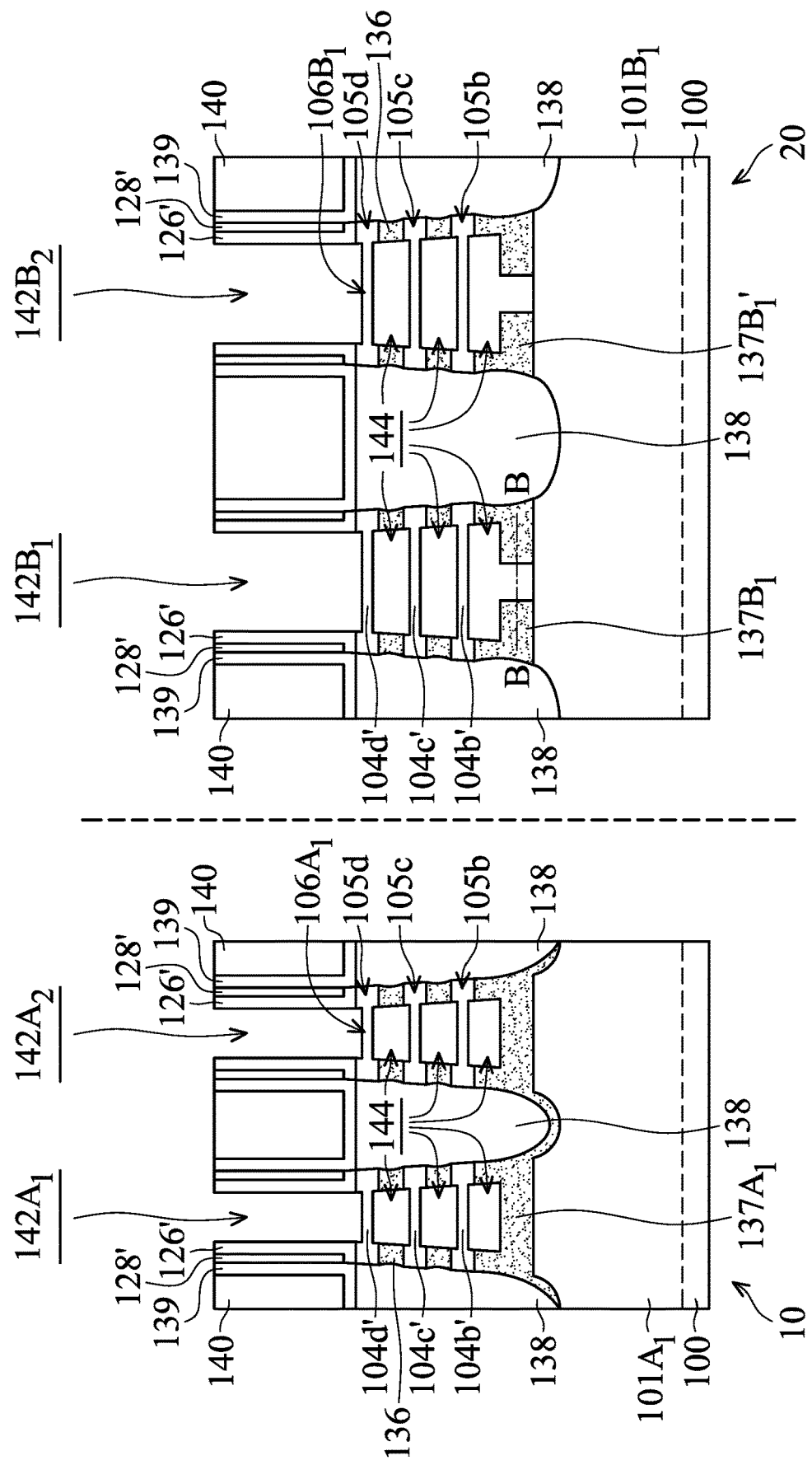

As shown in FIG. 4D, similar to the embodiments illustrated in FIG. 3J, the dummy gate dielectric layer 116 and the semiconductor layers 102b-102d (that function as sacrificial layers) are removed to form the recesses 144, in accordance with some embodiments. The remaining structures 102a' are also removed. Due to the removal of the remaining structures 102a', the recesses 144 penetrate through the isolation structures 137B$_1$ and 137B$_1$' to expose the semiconductor fin 101B$_1$.

In some embodiments, FIG. 5B is a cross-sectional view (or a plane view) of the structure taken along the line B-B in FIG. 4D. In some embodiments, the isolation structure 137B$_1$ has substantially straight edges and surrounds the recess 144, as shown in FIG. 5B.

In some embodiments, FIG. 6B is a cross-sectional view (or a plane view) of the structure taken along the line B-B in FIG. 4D. In some embodiments, the isolation structure 137B$_1$ has curved edges and surrounds the recess 144, as shown in FIG. 6B.

Figure 4E:
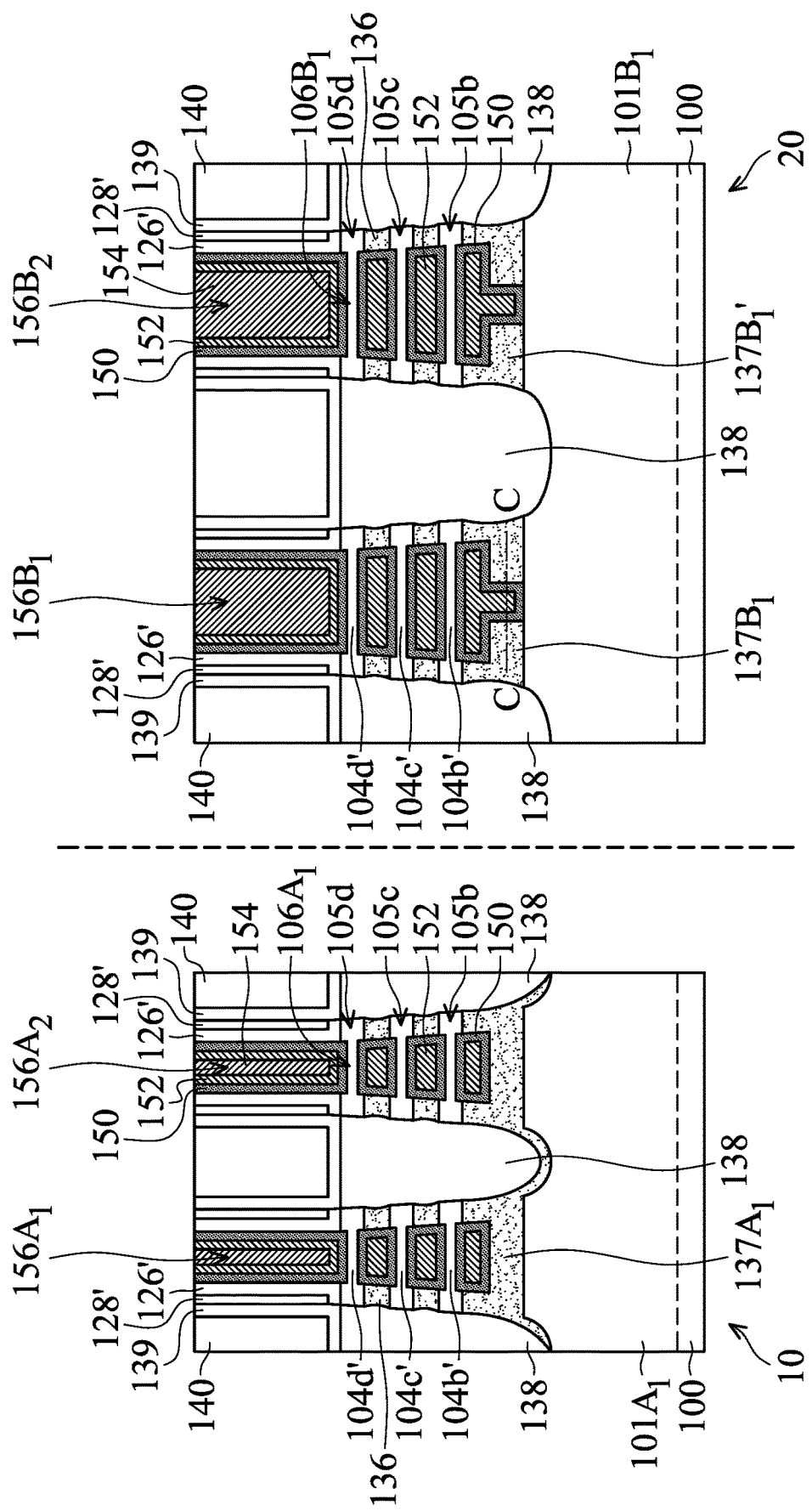

As shown in FIG. 4E, similar to the embodiments illustrated in FIG. 3K, the metal gate stacks 156A$_1$, 156A$_2$, 156B$_1$, and 156B$_2$ are formed, in accordance with some embodiments. In some embodiments, each of the metal gate stacks 156B$_1$, and 156B$_2$ has a protruding portion that penetrates into the isolation structure 137B$_1$ or 137B$_1$', as shown in FIG. 4E. In some embodiments, the protruding portion of the metal gate stacks 156B$_1$, and 156B$_2$ penetrate through the isolation structure 137B$_1$ or 137B$_1$'. In some embodiments, the metal gate stacks 156B$_1$ and 156B$_2$ are in direct contact with the semiconductor fin 101B$_1$. For example, the gate dielectric layer 150 or the interfacial layer (not shown) below the gate dielectric layer 150 is in direct contact with the semiconductor fin 101B$_1$.

In some embodiments, FIG. 5C is a cross-sectional view (or a plane view) of the structure taken along the line C-C in FIG. 4E. In some embodiments, the isolation structure 137B$_1$ has substantially straight edges and surrounds the metal gate stack 156B$_1$, as shown in FIG. 5C. The interface between the protruding portion of the metal gate stack 156B$_1$ and the isolation structure 137B$_1$ may be substantially straight.

In some embodiments, FIG. 6C is a cross-sectional view (or a plane view) of the structure taken along the line C-C in FIG. 4E. In some embodiments, the isolation structure 137B$_1$ has curved edges and surrounds the metal gate stack 156B$_1$, as shown in FIG. 6C. The interface between the protruding portion of the metal gate stack 156B$_1$ and the isolation structure 137B$_1$ may be curved. In some embodiments, the interface is a convex surface that faces an inner portion of the protruding portion of the metal gate stack 156B$_1$, as shown in FIG. 6C.

In some embodiments, each of the metal gate stacks 156A$_1$, 156A$_2$, 156B$_1$, and 156B$_2$ includes the conductive filling 154, as shown in FIGS. 3K and 4E. However, embodiments of the disclosure are not limited thereto. Many variations and/or modifications can be made to embodiments of the disclosure. In some other embodiments, some of the metal gate stacks are not large enough to contain the conductive filling 154.

Figure 7:
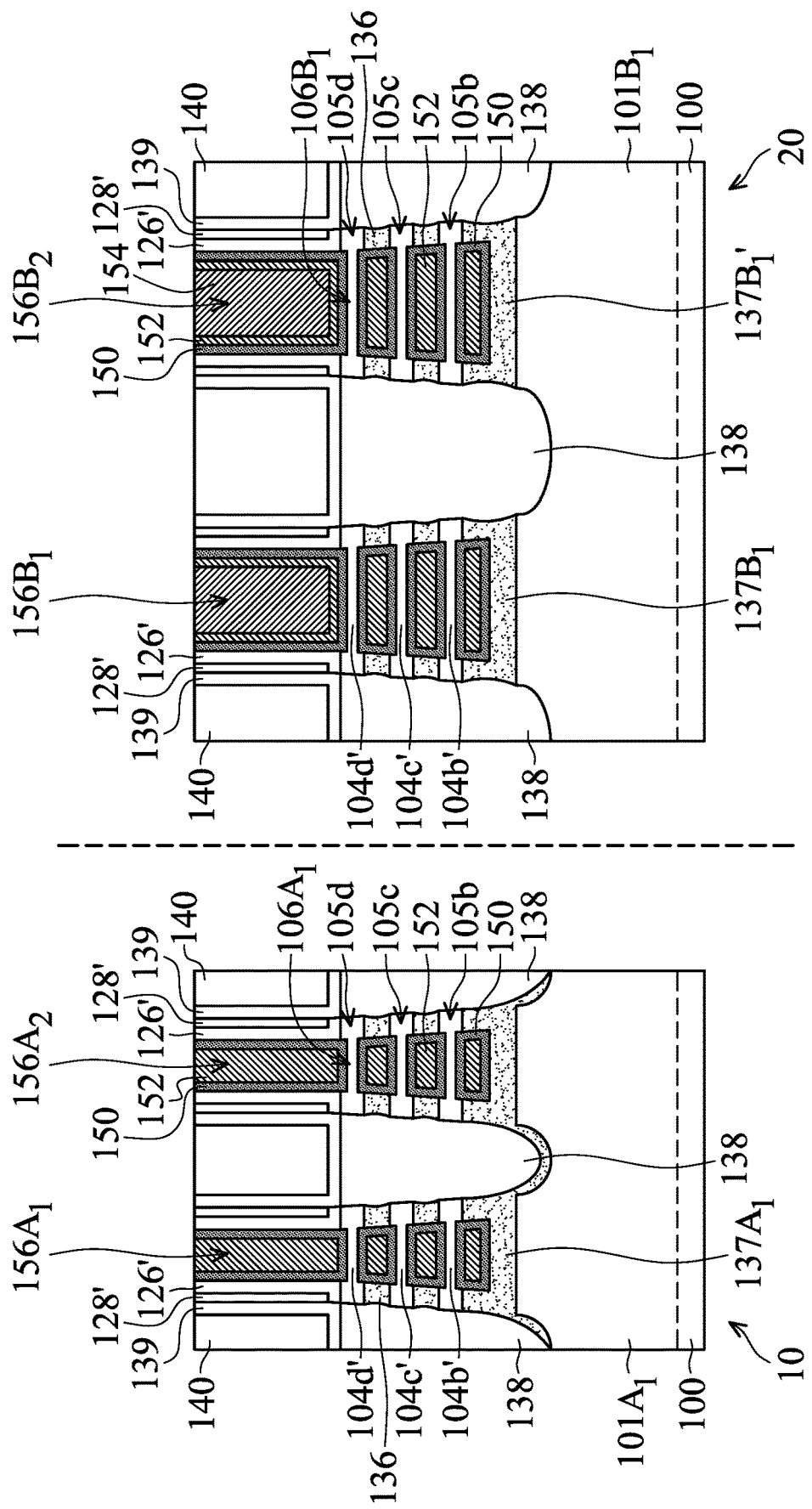
FIG. 7 is a cross-sectional view of a semiconductor device structure, in accordance with some embodiments.

FIG. 7 is a cross-sectional view of a semiconductor device structure, in accordance with some embodiments. As shown in FIG. 7, a structure similar to the structure shown in FIG. 3K is formed. In some embodiments, the trenches used to contain the metal gate stacks 156A$_1$ and 156A$_2$ have a narrow width. As a result, there may be no sufficient space for containing the conductive filling 154. The work function layer 152 may fill the remaining space of the trench during the formation of the metal gate stacks 156A$_1$ and 156A$_2$. In some embodiments, the trenches used to contain the metal gate stacks 156B$_1$ and 156B$_2$ have sufficient space for containing the conductive filling 154. Therefore, similar to the metal gate stacks 156B$_1$ and 156B$_2$ shown in FIG. 3K, the metal gate stacks 156B$_1$ and 156B$_2$ shown in FIG. 7 still have the conductive filling 154.

Figure 8:
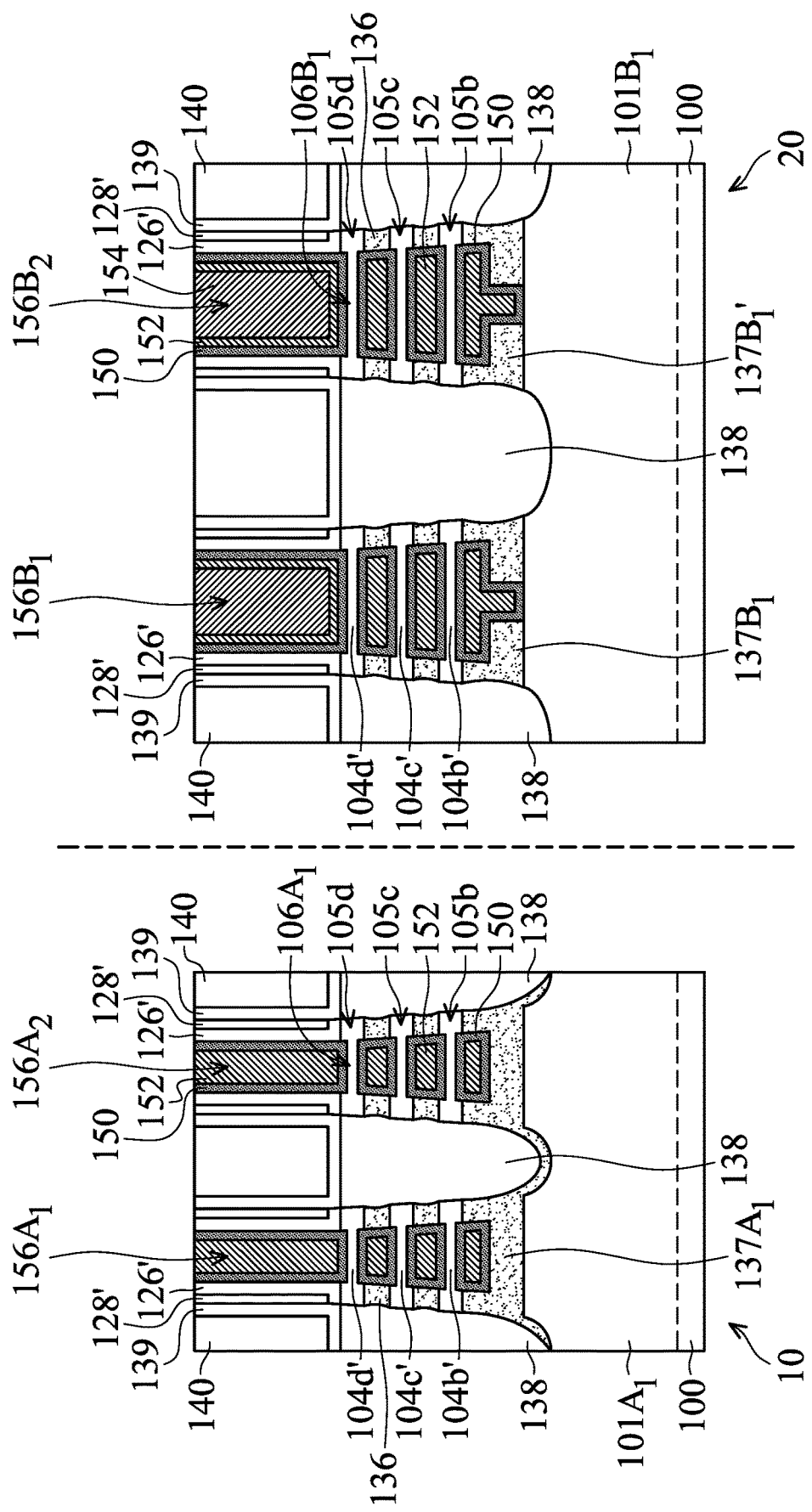
FIG. 8 is a cross-sectional view of a semiconductor device structure, in accordance with some embodiments.

FIG. 8 is a cross-sectional view of a semiconductor device structure, in accordance with some embodiments. As shown in FIG. 8, a structure similar to the structure shown in FIG. 4E is formed. In some embodiments, the trenches used to contain the metal gate stacks 156A$_1$ and 156A$_2$ have a narrow width. As a result, there may be no sufficient space for containing the conductive filling 154. The work function layer 152 may fill the remaining space of the trench during the formation of the metal gate stacks 156A$_1$ and 156A$_2$. In some embodiments, the trenches used to contain the metal gate stacks 156B$_1$ and 156B$_2$ have sufficient space for containing the conductive filling 154. Therefore, similar to the metal gate stacks 156B$_1$ and 156B$_2$ shown in FIG. 4E, the metal gate stacks 156B$_1$ and 156B$_2$ shown in FIG. 8 still have the conductive filling 154.

Figure 9:
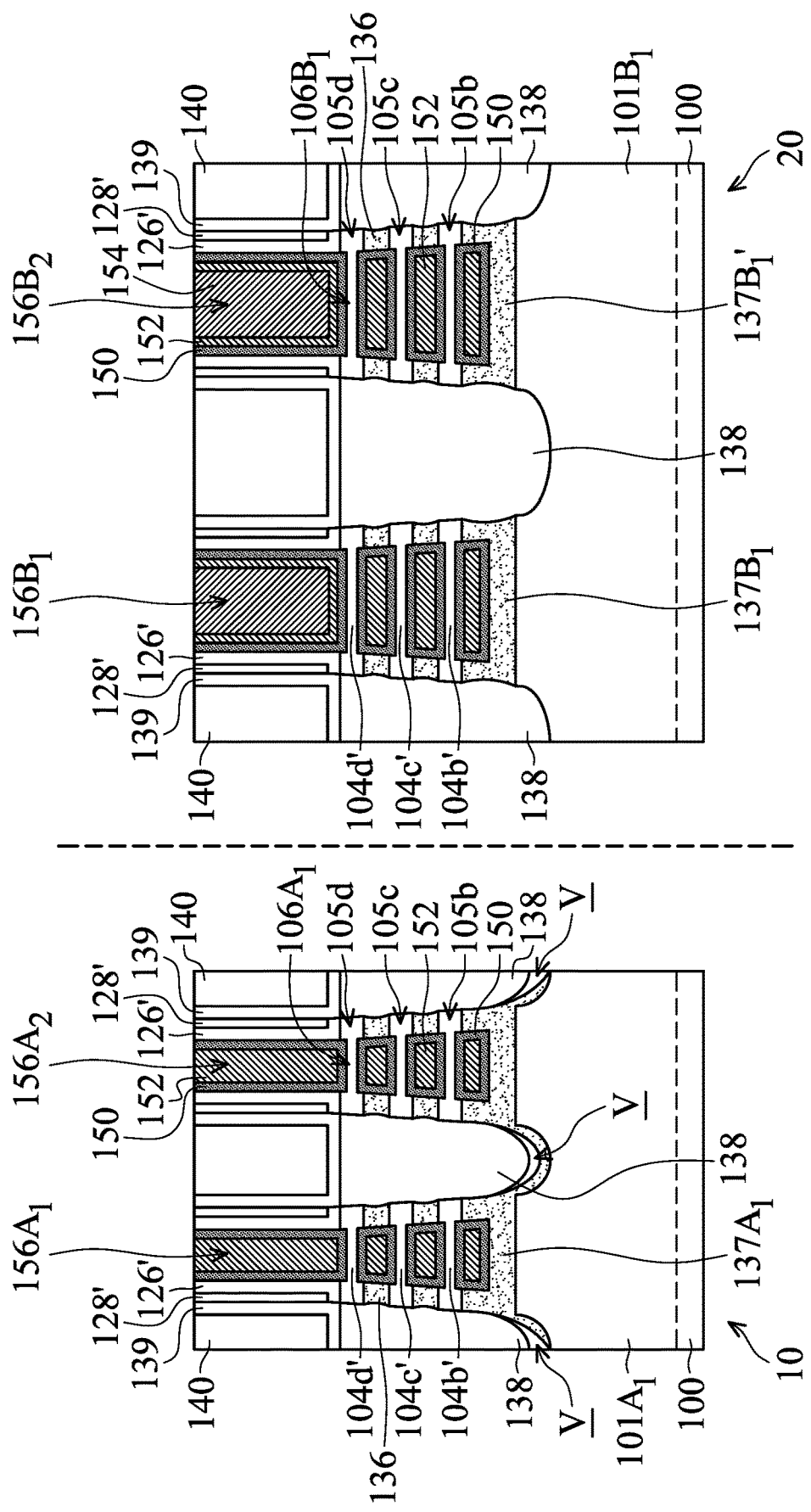
FIG. 9 is a cross-sectional view of a semiconductor device structure, in accordance with some embodiments.

Many variations and/or modifications can be made to embodiments of the disclosure. FIG. 9 is a cross-sectional view of a semiconductor device structure, in accordance with some embodiments. In some embodiments, a structure similar to the structure shown in FIG. 3K is formed. In some embodiments, the epitaxial structures 138 are formed using an epitaxial growth process. In the epitaxial growth process under some conditions, the semiconductor material may tend to be grown on the surfaces of elements made of a semiconductor material such as the surfaces of the edge elements 105b-105d. The semiconductor material may not tend to be grown on the surface of the isolation structure 137A$_1$. As a result, voids V are formed between the epitaxial structures 138 and the isolation structure 137A$_1$, as shown in FIG. 9 in accordance with some embodiments.

Figure 10:
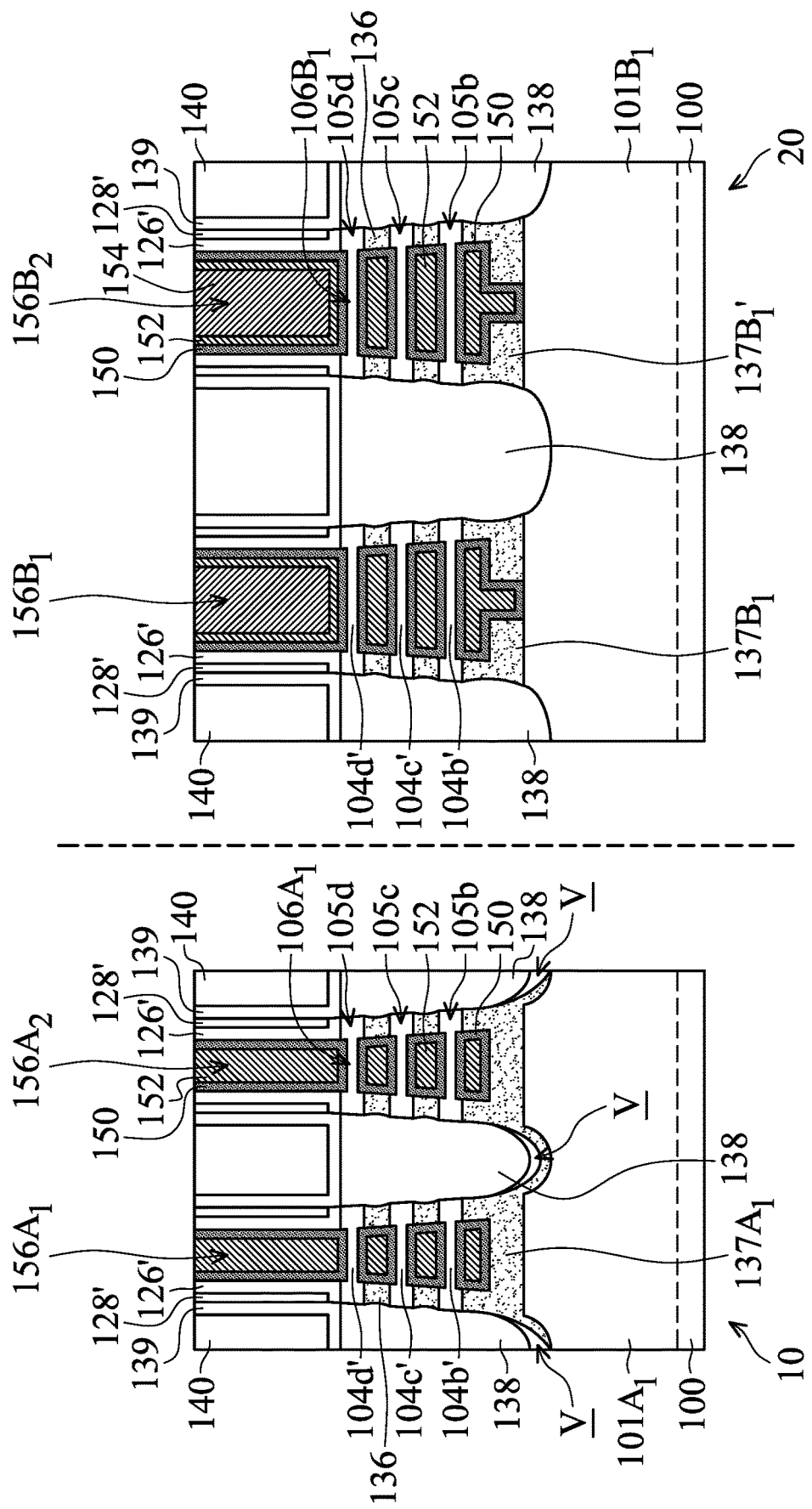
FIG. 10 is a cross-sectional view of a semiconductor device structure, in accordance with some embodiments.

FIG. 10 is a cross-sectional view of a semiconductor device structure, in accordance with some embodiments. In some embodiments, a structure similar to the structure shown in FIG. 4E is formed. In some embodiments, similar to the embodiments illustrated in FIG. 9, voids V are formed between the epitaxial structures 138 and the isolation structure 137A₁, as shown in FIG. 10 in accordance with some embodiments.

Figure 11:
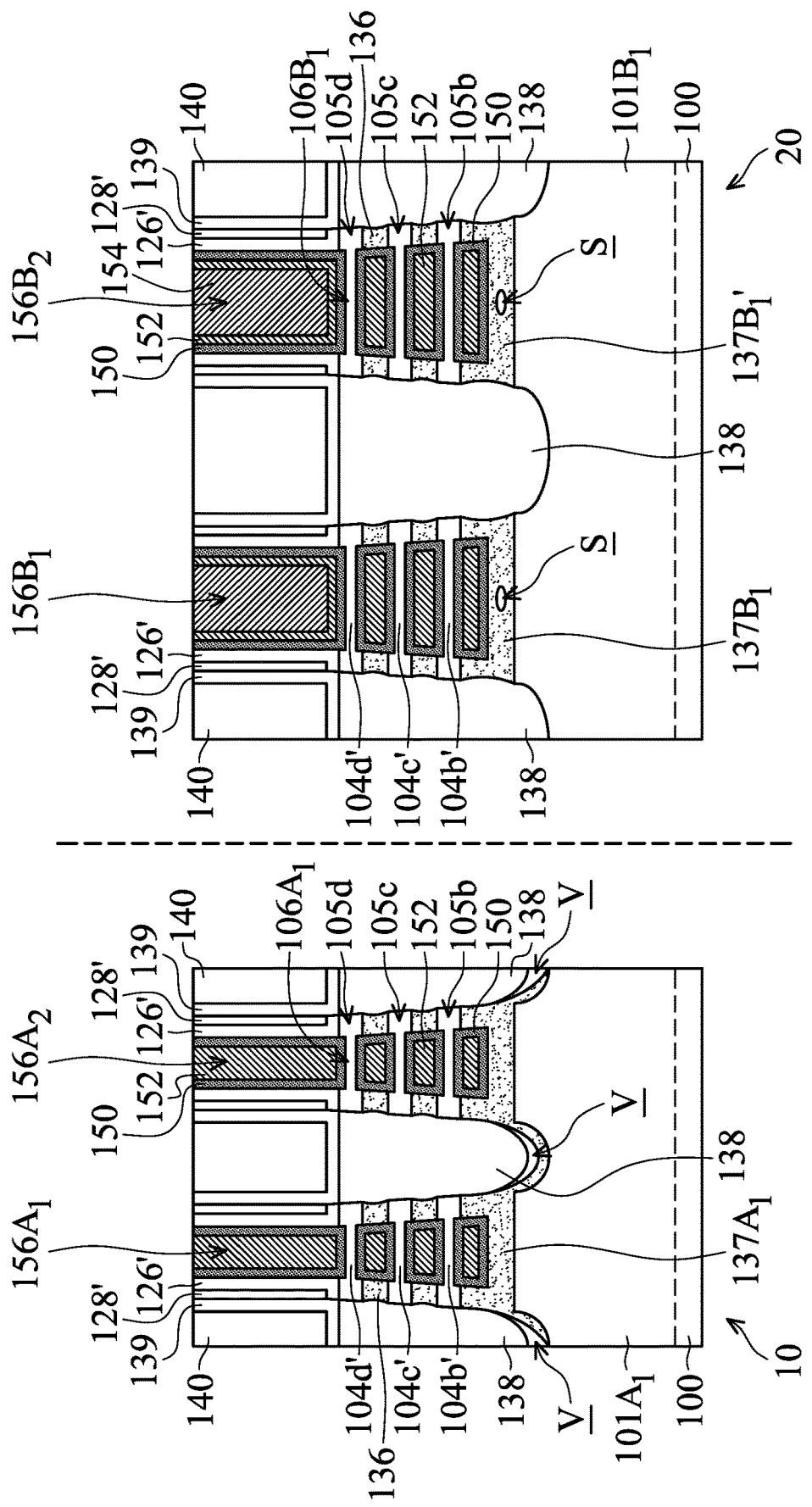
FIG. 11 is a cross-sectional view of a semiconductor device structure, in accordance with some embodiments.

Many variations and/or modifications can be made to embodiments of the disclosure. FIG. 11 is a cross-sectional view of a semiconductor device structure, in accordance with some embodiments. A structure similar to the structure shown in FIG. 3K is formed. In some embodiments, the spacer layer 134 may not be able to completely fill the recesses 133. As a result, one or more seams S may be formed in the isolation structures 137B₁ and/or 137B₁', as shown in FIG. 11 in accordance with some embodiments.

Figure 12:
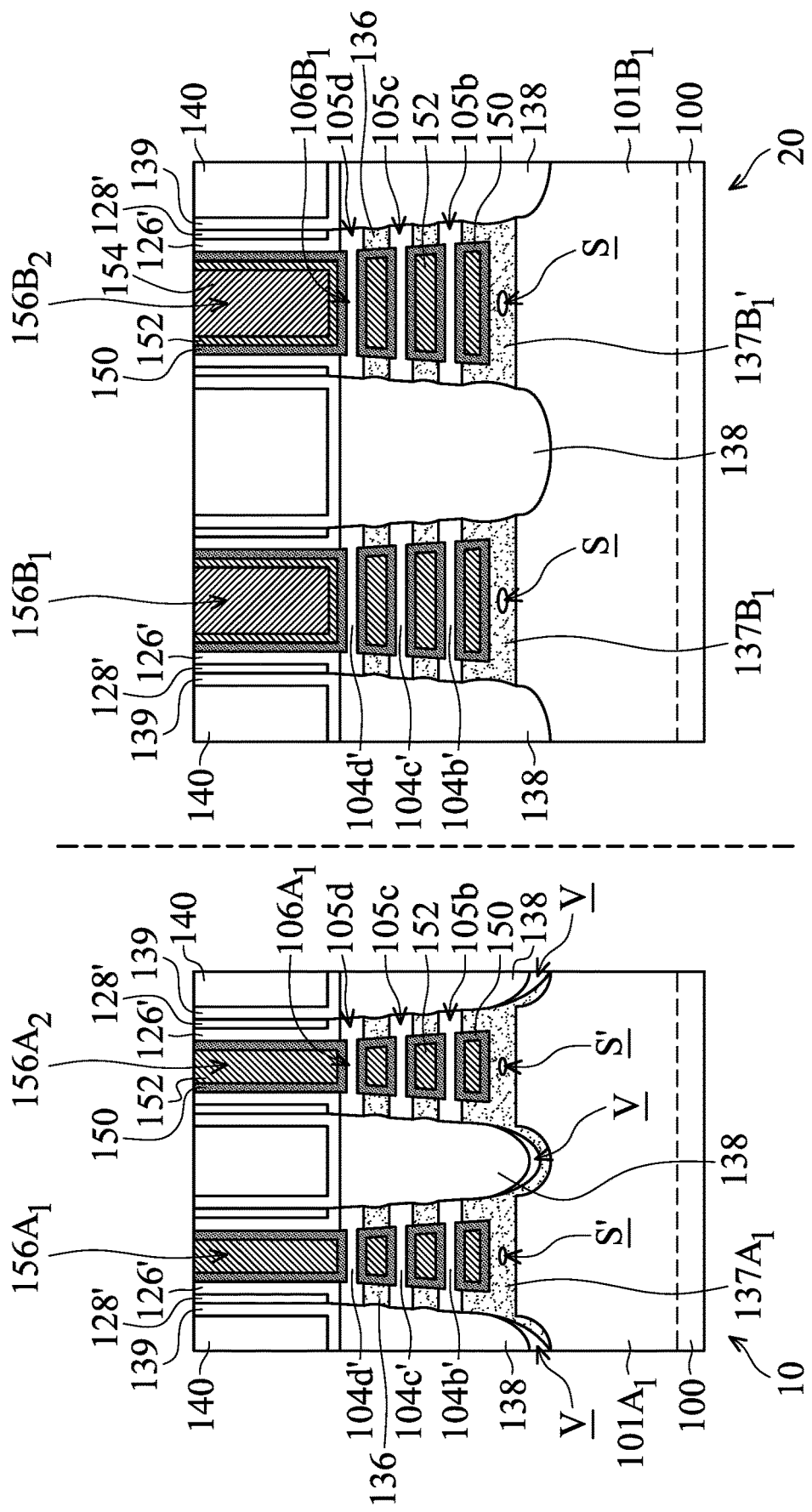
FIG. 12 is a cross-sectional view of a semiconductor device structure, in accordance with some embodiments.

Many variations and/or modifications can be made to embodiments of the disclosure. FIG. 12 is a cross-sectional view of a semiconductor device structure, in accordance with some embodiments. A structure similar to the structure shown in FIG. 3K is formed. In some embodiments, similar to the embodiments illustrated in FIG. 11, one or more seams S' may be formed in the isolation structures 137A₁, as shown in FIG. 12. In some embodiments, the seam S in the isolation structures 137B₁ or 137B₁' is larger than the seam S' in the isolation structures 137A₁.

Embodiments of the disclosure form a semiconductor device structure with an isolation structure between a channel structure and a substrate. The channel structure is wrapped around by a gate stack. For example, the semiconductor device structure includes a stack of multiple channel structures that are wrapped around by a metal gate stack. Epitaxial structures are formed adjacent to the channel structures. The isolation structure further extends exceeding opposite sidewalls of the epitaxial structures. Current leakage from the epitaxial structures is thus blocked by the isolation structure. The performance and reliability of the semiconductor device structure are greatly improved.

In accordance with some embodiments, a semiconductor device structure is provided. The semiconductor device structure includes a semiconductor fin over a substrate and multiple semiconductor nanostructures suspended over the semiconductor fin. The semiconductor device structure also includes a gate stack extending across the semiconductor fin, and the gate stack wraps around each of the semiconductor nanostructures. The semiconductor device structure further includes a first epitaxial structure and a second epitaxial structure sandwiching the semiconductor nanostructures. Each of the first epitaxial structure and the second epitaxial structure extends exceeding a top surface of the semiconductor fin. In addition, the semiconductor device structure includes an isolation structure between the semiconductor fin and the gate stack. The isolation structure further extends exceeding opposite sidewalls of the first epitaxial structure.

In accordance with some embodiments, a semiconductor device structure is provided. The semiconductor device structure includes multiple channel structures suspended over a substrate. The semiconductor device structure also includes a gate stack wrapping around the channel structures. The semiconductor device structure further includes a first epitaxial structure and a second epitaxial structure each connecting the channel structures. Each of the first epitaxial structure and the second epitaxial structure extends exceeding a bottom surface of the gate stack. In addition, the semiconductor device structure includes an isolation structure between the channel structures and the substrate. An entirety of the first epitaxial structure is above a bottom surface of the isolation structure.

In accordance with some embodiments, a method for forming a semiconductor device structure is provided. The method includes forming a fin structure over a substrate. The fin structure has a sacrificial base layer and a semiconductor stack over the sacrificial base layer. The semiconductor stack has multiple sacrificial layers and multiple semiconductor layers laid out alternately. The method also includes forming a dummy gate stack to wrap around a portion of the fin structure. The method further includes partially removing the fin structure to form a first recess exposing side surfaces of the semiconductor layers and the sacrificial layers. In addition, the method includes partially or completely removing the sacrificial base layer to form a second recess between the semiconductor stack and the substrate. The method includes forming an isolation structure to fill the second recess and forming an epitaxial structure in the first recess. The method also includes removing the dummy gate stack and the sacrificial layer to release multiple semiconductor nanostructures made up of remaining portions of the semiconductor layers. The method further includes forming a metal gate stack to wrap around each of the semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a plurality of semiconductor nanostructures;
   a gate stack wrapped around the semiconductor nanostructures;
   a first epitaxial structure and a second epitaxial structure sandwiching at least one of the semiconductor nanostructures; and
   an isolation structure below a bottommost surface of the semiconductor nanostructures, wherein the isolation structure is a continuous structure extending across edges of the semiconductor nanostructures and extending along opposite edges of a lower portion of the first epitaxial structure.

2. The semiconductor device structure as claimed in claim 1, wherein the isolation structure further extends along a bottom of the first epitaxial structure.

3. The semiconductor device structure as claimed in claim 1, further comprising a plurality of inner spacers, wherein each of the inner spacers is beside the gate stack, and the inner spacers and the isolation structure are made of a same material.

4. The semiconductor device structure as claimed in claim 1, further comprising at least one void between the isolation structure and the first epitaxial structure, wherein the first epitaxial structure is wider than the at least one void.

5. The semiconductor device structure as claimed in claim 1, wherein the isolation structure extends across the opposite edges of the first epitaxial structure.

6. The semiconductor device structure as claimed in claim 1, further comprising:
   a plurality of second semiconductor nanostructures, wherein each of the second semiconductor nanostructures is wider than each of the semiconductor nanostructures;

a second gate stack wrapped around the second semiconductor nanostructures;

a third epitaxial structure and a fourth epitaxial structure sandwiching at least one of the second semiconductor nanostructures; and a second isolation structure below the second gate stack, wherein the third epitaxial structure extends across opposite surfaces of the second isolation structure.

7. The semiconductor device structure as claimed in claim 6, wherein the third epitaxial structure is in direct contact with the second isolation structure.

8. The semiconductor device structure as claimed in claim 6, wherein the second gate stack has a protruding portion penetrating through the second isolation structure.

9. The semiconductor device structure as claimed in claim 8, wherein an interface between the protruding portion of the second gate stack and the second isolation structure is a convex surface facing an inner portion of the protruding portion of the second gate stack.

10. The semiconductor device structure as claimed in claim 6, further comprising a seam within the second isolation structure, wherein the second semiconductor nanostructures extend across opposite edges of the seam.

11. A semiconductor device structure, comprising:
a plurality of channel structures over a substrate;
a gate stack wrapped around the channel structures;
a first epitaxial structure and a second epitaxial structure each connecting at least one of the channel structures; and
an isolation structure between the channel structures and the substrate, wherein the isolation structure is a continuous structure extending across opposite edges of the first epitaxial structure and at least one edge of the second epitaxial structure and wrapped around a lower portion of the first epitaxial structure.

12. The semiconductor device structure as claimed in claim 11, wherein the isolation structure is wider than each of the channel structures.

13. The semiconductor device structure as claimed in claim 11, further comprising:
a plurality of second channel structures over the substrate;
a second gate stack wrapped around each of the second channel structures, wherein the second gate stack is wider than the gate stack;
a third epitaxial structure and a fourth epitaxial structure each connecting at least one of the second channel structures, wherein each of the third epitaxial structure and the fourth epitaxial structure extends exceeding a bottom surface of the second gate stack; and
a second isolation structure between the second channel structures and the substrate.

14. The semiconductor device structure as claimed in claim 13, wherein the third epitaxial structure extends exceeding a bottom surface of the second isolation structure.

15. The semiconductor device structure as claimed in claim 13, wherein the second gate stack has a protruding portion penetrating into the second isolation structure.

16. The semiconductor device structure as claimed in claim 13, further comprising a seam within the second isolation structure.

17. A semiconductor device structure, comprising:
a plurality of channel structures over a substrate;
a gate stack wrapped around the channel structures;
a first epitaxial structure and a second epitaxial structure each connecting the at least one of the channel structures; and
an isolation structure between the channel structures and the substrate, wherein the isolation structure is a continuous structure extending across opposite edges of the first epitaxial structure, the isolation structure extends along the opposite edges of the first epitaxial structure, and the isolation structure is wider than each of the channel structures.

18. The semiconductor device structure as claimed in claim 17, further comprising:
a plurality of second channel structures over the substrate;
a second gate stack wrapped around each of the second channel structures, wherein the second gate stack is wider than the gate stack;
a third epitaxial structure and a fourth epitaxial structure each connecting at least one of the second channel structures; and
a second isolation structure between the second channel structures and the substrate.

19. The semiconductor device structure as claimed in claim 18, wherein the second isolation structure is sandwiched between the third epitaxial structure and the fourth epitaxial structure.

20. The semiconductor device structure as claimed in claim 19, wherein the isolation structure is wider than the second isolation structure.

* * * * *